(12) United States Patent
Mitomo

(10) Patent No.: US 12,706,436 B2
(45) Date of Patent: Aug. 11, 2026

(54) SURFACE EMITTING LASER DEVICE, ELECTRONIC DEVICE, AND MANUFACTURING METHOD FOR SURFACE EMITTING LASER DEVICE

(71) Applicant: SONY SEMICONDUCTOR SOLUTIONS CORPORATION, Kanagawa (JP)

(72) Inventor: Jugo Mitomo, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 687 days.

(21) Appl. No.: 18/042,720

(22) PCT Filed: Jul. 19, 2021

(86) PCT No.: PCT/JP2021/026962
§ 371 (c)(1),
(2) Date: Feb. 23, 2023

(87) PCT Pub. No.: WO2022/054411
PCT Pub. Date: Mar. 17, 2022

(65) Prior Publication Data

US 2023/0352906 A1 Nov. 2, 2023

(30) Foreign Application Priority Data

Sep. 9, 2020 (JP) ................................ 2020-151177

(51) Int. Cl.
*H01S 5/0237* (2021.01)
*H01S 5/0233* (2021.01)
(Continued)

(52) U.S. Cl.
CPC .......... *H01S 5/0237* (2021.01); *H01S 5/0233* (2021.01); *H01S 5/18305* (2013.01); *H01S 5/423* (2013.01)

(58) Field of Classification Search
CPC ...................................................... H01S 5/423
See application file for complete search history.

(56) References Cited

U.S. PATENT DOCUMENTS

2002/0072138 A1* 6/2002 Trezza .................... H10F 55/25 438/455
2018/0278011 A1* 9/2018 Galvano .............. G01S 7/4813
(Continued)

FOREIGN PATENT DOCUMENTS

JP 08-288336 A 11/1996
JP 11-097569 A 4/1999
(Continued)

OTHER PUBLICATIONS

J. Liu, C. Andersson, Y. Gao and Q. Zhai, "Recent Development of Nano-solder Paste for Electronics Interconnect Applications," 2008 10th Electronics Packaging Technology Conference, Singapore, 2008, pp. 84-93, doi: 10.1109/EPTC.2008.4763416. (Year: 2008).*
(Continued)

*Primary Examiner* — Minsun O Harvey
*Assistant Examiner* — Stephen Sutton Kotter
(74) *Attorney, Agent, or Firm* — CHIP LAW GROUP

(57) ABSTRACT

Provided are a surface emitting laser device and an electronic device that includes the surface emitting laser device. The is a surface emitting laser device includes an element unit including an element arrangement area in which a plurality of surface emitting laser elements is arranged, and an adjacent area adjacent to the element arrangement area. The surface emitting laser device further includes a driver unit including a driver IC, a plurality of first bumps that
(Continued)

individually joins each of the plurality of surface emitting laser elements and the driver unit; and a plurality of second bumps that joins the adjacent area and the driver unit. Each of the plurality of first bumps and each of the plurality of second bumps include a conductive material that becomes difficult to be crushed by pressurization. The plurality of second bumps is arranged at a higher density than the plurality of first bumps.

11 Claims, 36 Drawing Sheets

(51) Int. Cl.
*H01S 5/183* (2006.01)
*H01S 5/42* (2006.01)

(56) References Cited

U.S. PATENT DOCUMENTS

2019/0036308 A1 1/2019 Carson et al.
2019/0237931 A1 8/2019 Pao
2020/0169065 A1 * 5/2020 Carson .................... H01S 5/423

FOREIGN PATENT DOCUMENTS

JP 2007-324581 A 12/2007
JP 2013-084846 A 5/2013
WO 2020/100572 A1 5/2020

OTHER PUBLICATIONS

International Search Report and Written Opinion of PCT Application No. PCT/JP2021/026962, issued on Sep. 28, 2021, 12 pages of ISRWO.

* cited by examiner 15
101
102
103
104
105
106
107
108
AA2
109
MS2
CH2
BP2
BP2
BP2
112
CH3
113
111
103b
103a
103
MS1
BP1
CH1
110
108
100
109
107
106
105
104
102
101
20

FIG. 25
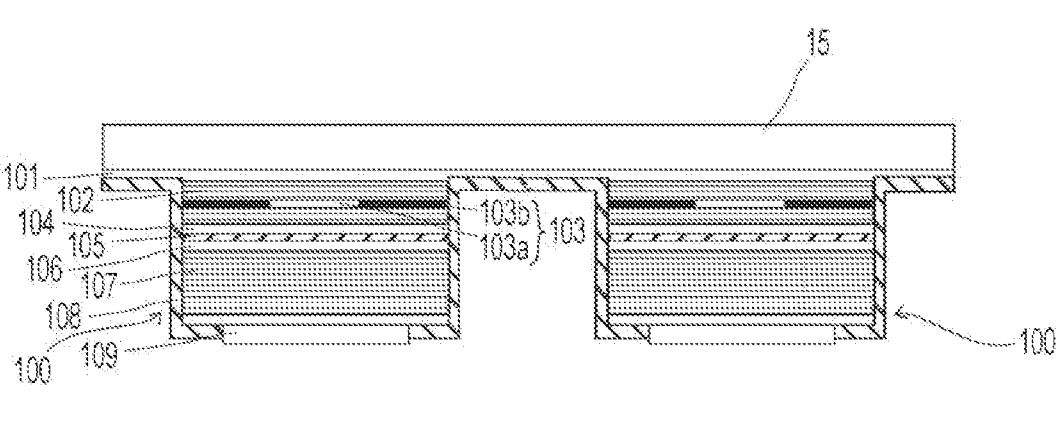
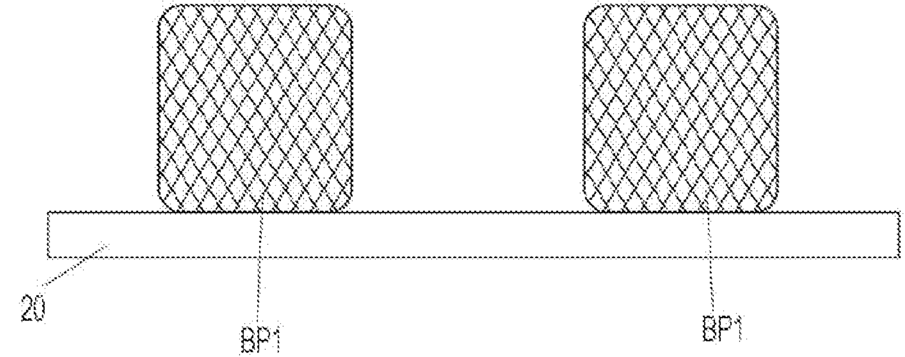

Figure 35:
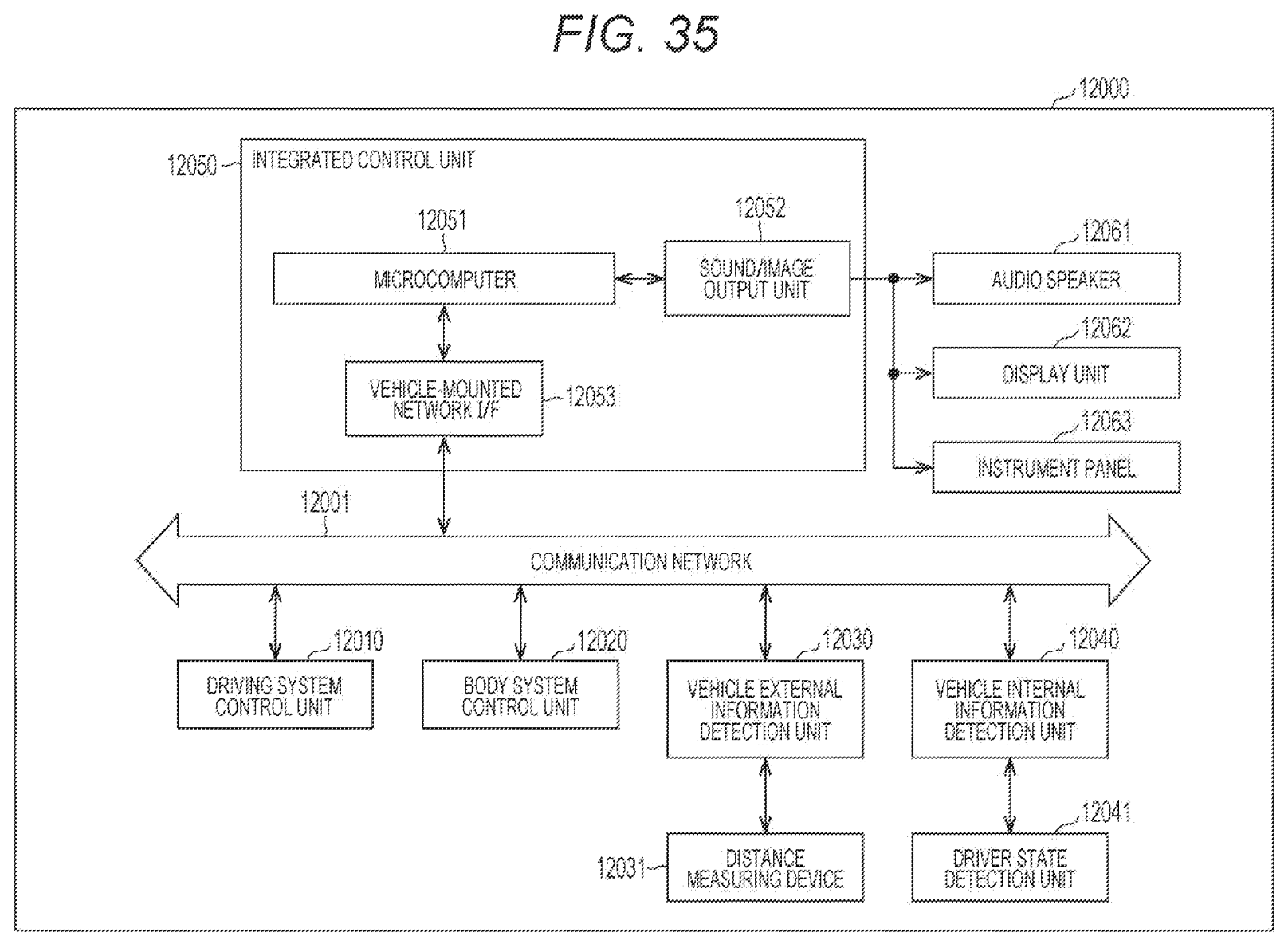

12050 INTEGRATED CONTROL UNIT

12051 MICROCOMPUTER

12052 SOUND/IMAGE OUTPUT UNIT

12053 VEHICLE-MOUNTED NETWORK I/F

12061 AUDIO SPEAKER

12062 DISPLAY UNIT

12063 INSTRUMENT PANEL

12001 COMMUNICATION NETWORK

12010 DRIVING SYSTEM CONTROL UNIT

12020 BODY SYSTEM CONTROL UNIT

12030 VEHICLE EXTERNAL INFORMATION DETECTION UNIT

12031 DISTANCE MEASURING DEVICE

12040 VEHICLE INTERNAL INFORMATION DETECTION UNIT

12041 DRIVER STATE DETECTION UNIT

SURFACE EMITTING LASER DEVICE, ELECTRONIC DEVICE, AND MANUFACTURING METHOD FOR SURFACE EMITTING LASER DEVICE

CROSS REFERENCE TO RELATED APPLICATIONS

This application is a U.S. National Phase of International Patent Application No. PCT/JP2021/026962 filed on Jul. 19, 2021, which claims priority benefit of Japanese Patent Application No. JP 2020-151177 filed in the Japan Patent Office on Sep. 9, 2020. Each of the above-referenced applications is hereby incorporated herein by reference in its entirety.

TECHNICAL FIELD

The technology according to the present disclosure (hereinafter also referred to as "the present technology") relates to a surface emitting laser device, an electronic device, and a manufacturing method for the surface emitting laser device.

BACKGROUND ART

Conventionally, there is known a technique of joining a semiconductor device (for example, a semiconductor chip) having a plurality of semiconductor elements to a board via a member having high mechanical strength (for example, see Patent Document 1).

CITATION LIST

Patent Document

Patent Document 1: Japanese Patent Application Laid-Open No. H8-288336

SUMMARY OF THE INVENTION

Problems to be Solved by the Invention

However, in the above-described conventional technique, there has been room for improvement in suppressing variation in interval between the semiconductor device and the board while suppressing breakage of the semiconductor device.

Therefore, a main object of the present technology is to provide a surface emitting laser device capable of suppressing variation in interval between an element unit and a driver unit while suppressing breakage of the element unit.

Solutions to Problems

The present technology provides a surface emitting laser device including:

an element unit including an element arrangement area in which a plurality of surface emitting laser elements is arranged and an adjacent area adjacent to the element arrangement area;

a driver unit including a driver IC;

a plurality of first bumps that individually joins each of the plurality of surface emitting laser elements and the driver unit; and a plurality of second bumps that joins the adjacent area and the driver unit, in which each of the plurality of first bumps and the plurality of second bumps contains a conductive material that becomes difficult to be crushed by pressurization, and the plurality of second bumps is arranged at a higher density than the plurality of first bumps.

Each of the plurality of surface emitting laser elements may have a mesa structure protruding toward the driver unit side and including an electrode at a top, and the electrode and the driver unit may be joined via the first bumps.

The conductive material may be metal particle paste.

The conductive material may be metal nano paste.

The arrangement density of the plurality of second bumps may be higher than the arrangement density of the plurality of surface emitting laser elements.

The adjacent area may include at least first and second areas respectively located on one side and another side sandwiching the element arrangement area.

The element unit may have a multilayer structure including first and second multilayer film reflectors and an active layer disposed between the first and second multilayer film reflectors, the element arrangement area may constitute a part of the multilayer structure in an in-plane direction, and the adjacent area may constitute another part of the multilayer structure in the in-plane direction.

The driver unit may include a semiconductor board on which the driver IC is formed, and a wiring layer layered on the semiconductor board, and the wiring layer may be joined to the plurality of surface emitting laser elements via the plurality of first bumps, and joined to the adjacent area via the plurality of second bumps.

The present technology also provides an electronic device including the surface emitting laser device.

The present technology also provides a manufacturing method for a surface emitting laser device including: an element unit including an element arrangement area in which a plurality of surface emitting laser elements is arranged and an adjacent area adjacent to the element arrangement area; and a driver unit including a driver IC, the manufacturing method including:

a joining step of joining each of the plurality of surface emitting laser elements and the driver unit via a plurality of first bumps, and joining the adjacent area and the driver unit via a plurality of second bumps, in which the plurality of first bumps and the plurality of second bumps contain a conductive material that becomes difficult to be crushed by pressurization, and in the joining step, the plurality of second bumps is arranged at a higher density than the plurality of first bumps.

The manufacturing method for the surface emitting laser device according to the present technology may further include: prior to the joining step, a step of arranging the plurality of first bumps in an area in the driver unit corresponding to the element arrangement area; and a step of arranging the plurality of second bumps in an area in the driver unit corresponding to the adjacent area at a higher density than the plurality of first bumps.

BRIEF DESCRIPTION OF DRAWINGS

FIG. 25 is a partially enlarged view (part 1) of FIG. 24.

FIG. 35 is a block diagram illustrating an example of a schematic configuration of a vehicle control system.

MODE FOR CARRYING OUT THE INVENTION

Figure 1:
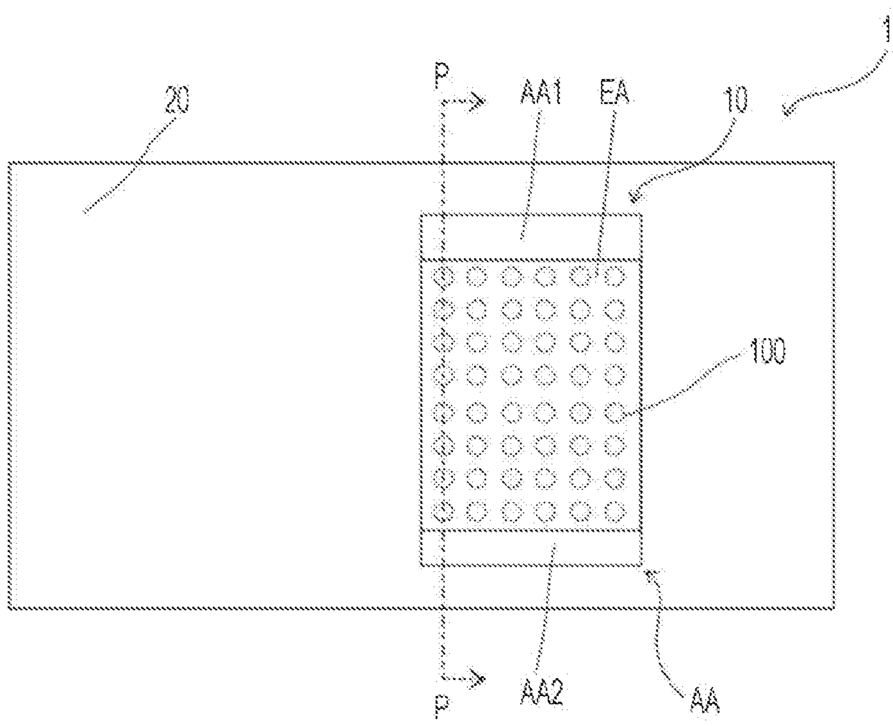
FIG. 1 is a plan view of a surface emitting laser device according to one embodiment of the present technology.

Hereinafter, a preferred embodiment of the present technology will be described in detail with reference to the accompanying drawings. Note that, in this specification and the drawings, components having substantially the same functional configuration are denoted by the same reference numerals, and redundant explanations are omitted. The embodiment described below shows one example of a representative embodiment of the present technology, and does not cause the scope of the present technology to be narrowly interpreted. In this specification, even in a case where it is described that each of a surface emitting laser device, an electronic device, and a manufacturing method for the surface emitting laser device according to the present technology exhibits a plurality of effects, it suffices that each of the surface emitting laser device, the electronic device, and the manufacturing method for the surface emitting laser device according to the present technology exhibits at least one effect. The effects described in this specification are merely examples and are not limited, and other effects may also be present.

Furthermore, the description will be given in the following order.

1. Configuration of surface emitting laser device according to one embodiment of present technology
2. Operation of surface emitting laser device according to one embodiment of present technology
3. Manufacturing method for surface emitting laser device according to one embodiment of present technology
4. Effect of surface emitting laser device and effect of manufacturing method thereof according to one embodiment of present technology
5. Modification of one embodiment of present technology
6. Example in which surface emitting laser device is applied to distance measuring device
7. Example in which distance measuring device is mounted on mobile object <Application Example to Electronic Device>

1. <Configuration of Surface Emitting Laser Device According to One Embodiment of Present Technology>

(Overall Configuration)

Figure 2:
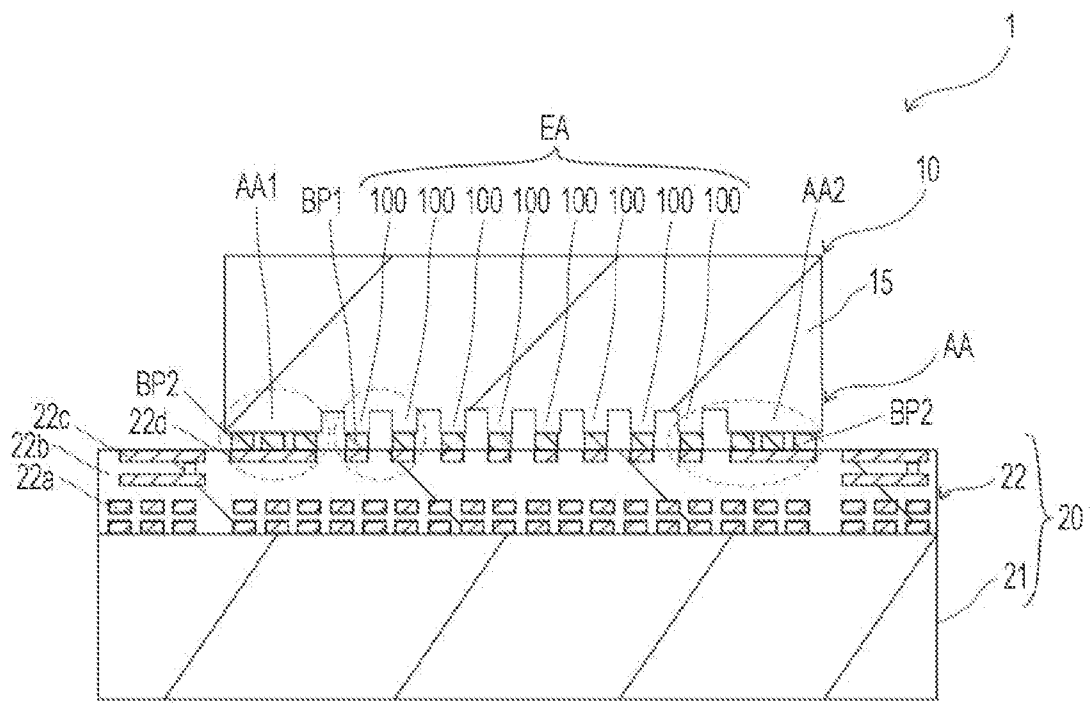
FIG. 2 is a cross-sectional view taken along line P-P of FIG. 1.

FIG. 1 is a plan view of a surface emitting laser device 1 according to one embodiment of the present technology. FIG. 2 is a cross-sectional view of the surface emitting laser device 1 (a cross-sectional view taken along line P-P in FIG. 1).

As illustrated in FIGS. 1 and 2, the surface emitting laser device 1 includes an element unit 10 and a driver unit 20 including a driver IC.

The element unit 10 is disposed on the driver unit 20.

As illustrated in FIG. 2, the element unit 10 and the driver unit 20 are electrically connected via a plurality of bumps BP (BP1, BP2).

More specifically, the surface emitting laser device 1 further includes a plurality of first bumps BP1 that joins each of a plurality of surface emitting laser elements 100 and the driver unit 20, and a plurality of second bumps BP2 that joins an adjacent area AA and the driver unit 20.

(Element Unit)

As illustrated in FIG. 1, the element unit 10 includes an element arrangement area EA in which the plurality of surface emitting laser elements 100 is arranged, and the adjacent area AA adjacent to the element arrangement area EA. The element unit 10 is a chip-shaped unit as a whole, and is also called a laser chip.

As an example, the adjacent area AA includes first and second adjacent areas AA1 and AA2 respectively located on one side and another side sandwiching the element arrangement area EA.

In the element arrangement area EA, as illustrated in FIG. 2, the plurality of surface emitting laser elements 100 is two-dimensionally arranged (for example, matrix arrangement, staggered arrangement, random arrangement, or the like) on a board 15.

Figure 3:
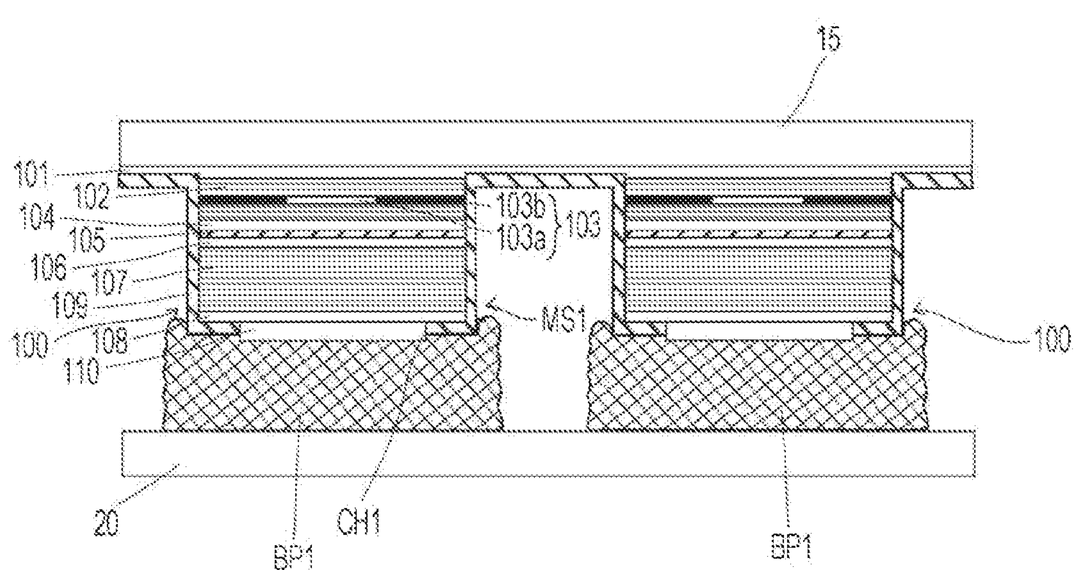
FIG. 3 is a partially enlarged view extracting and illustrating a part of an element arrangement area in FIG. 2.
Figure 4:
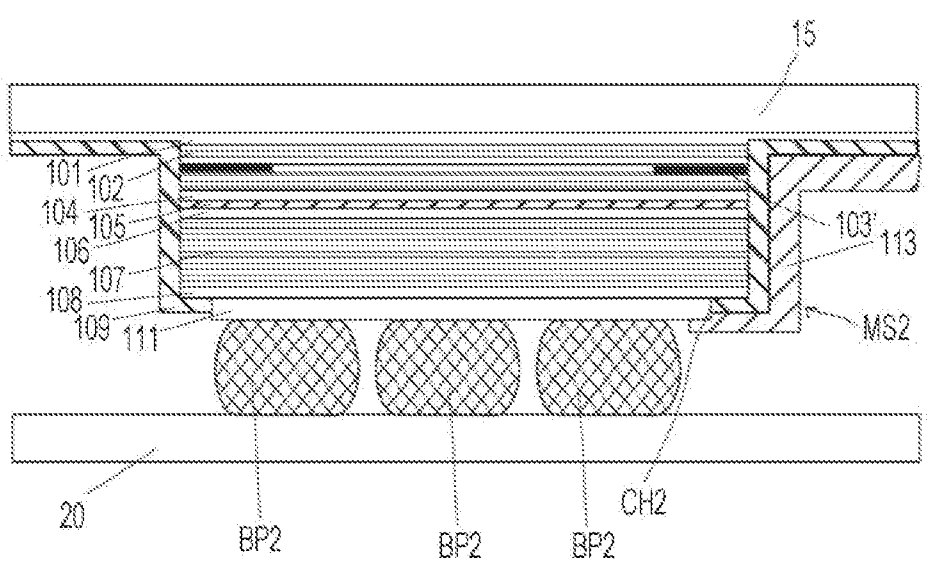
FIG. 4 is a partially enlarged view extracting and illustrating a part of an adjacent area in FIG. 2.
Figure 5:
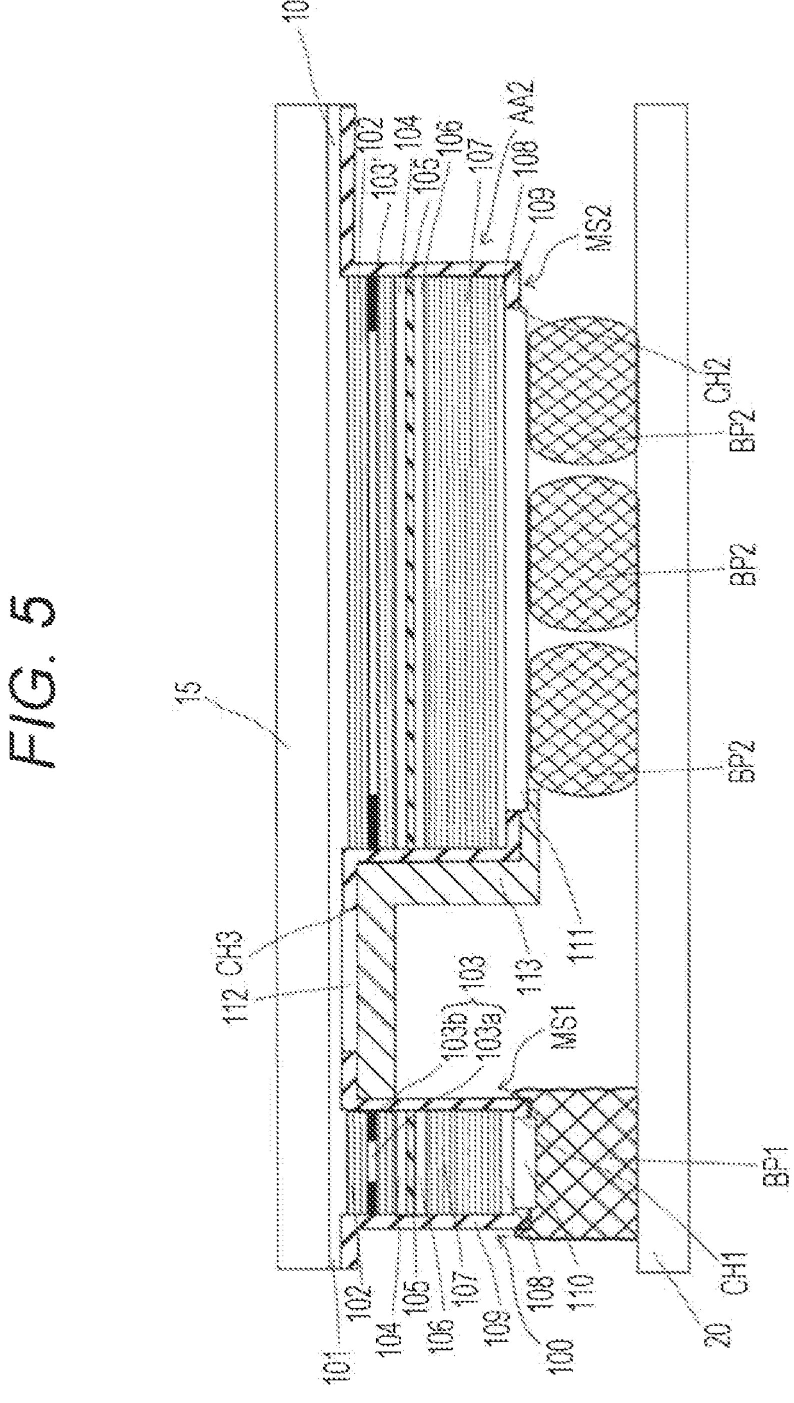
FIG. 5 is a partially enlarged view extracting and illustrating an area extending over the element arrangement area and the adjacent area in FIG. 2.

FIG. 3 is a partially enlarged view extracting and illustrating a part of the element arrangement area in FIG. 2 (an area surrounded by a one-dot chain line in FIG. 2). FIG. 4 is a partially enlarged view extracting and illustrating a part of the adjacent area in FIG. 2 (an area surrounded by a two-dot chain line in FIG. 2). FIG. 5 is a partially enlarged view extracting and illustrating an area extending over the element arrangement area and the adjacent area in FIG. 2 (an area surrounded by a broken line in FIG. 2).

The element unit 10 has a multilayer structure as illustrated in FIGS. 3 to 5.

In the multilayer structure, a first contact layer 101, a first multilayer film reflector 102, a first spacer layer 104, an active layer 105, a second spacer layer 106, a second multilayer film reflector 107, a second contact layer 108, and an electrode are layered in this order on the board 15.

That is, the multilayer structure includes the first and second multilayer film reflectors 102 and 107, and the active layer 105 disposed between the first and second multilayer film reflectors 102 and 107.

The element arrangement area EA constitutes a part of the multilayer structure in an in-plane direction (a direction orthogonal to a layering direction), and the adjacent area AA constitutes another part of the multilayer structure in the in-plane direction (a direction orthogonal to the layering direction).

In the element arrangement area EA, each of the plurality of surface emitting laser elements 100 has a mesa structure MS1 protruding toward the driver unit 20 side and including a cathode electrode 110 at the top, as illustrated in FIG. 3. The cathode electrode 110 and the driver unit 20 are joined via the first bumps BP1.

The mesa structure MS1 constitutes a part of the multilayer structure in the in-plane direction (however, at least the board 15 is excluded) in which the cathode electrode 110 is an uppermost layer (a layer farthest from the board 15). The mesa structure MS1 functions as a laser resonator of the surface emitting laser element 100.

As illustrated in FIG. 4, each of the first and second adjacent areas AA1 and AA2 of the adjacent area AA has a mesa structure MS2 protruding toward the driver unit 20 side and including an electrode 111 at the top.

The mesa structure MS2 constitutes another part of the multilayer structure in the in-plane direction (however, at least the board 15 is excluded) in which the electrode 111 is an uppermost layer (a layer farthest from the board 15).

Each mesa structure has, for example, a substantially cylindrical shape in plan view, but may have another columnar shape such as a polygonal columnar shape.

The multilayer structure is covered with an insulating film 109 except for an area where the electrode is disposed. The insulating film 109 contains, for example, $SiO_2$, SiN, SiON, or the like.

As illustrated in FIG. 3, in the insulating film 109 covering the top of the mesa structure MS1, a contact hole CH1 for electrode extraction is formed. In the contact hole CH1, the cathode electrode 110 is disposed so as to be in contact with the second contact layer 108 of the mesa structure MS1.

As illustrated in FIG. 4, in the insulating film 109 covering the top of the mesa structure MS2, a contact hole CH2 for electrode extraction is formed. In the contact hole CH2, the electrode 111 is disposed so as to be in contact with the second contact layer 108 of the mesa structure MS2.

The board 15 is, as an example, a GaAs board of a first conductivity type. The board 15 is transparent to an oscillation wavelength of the surface emitting laser element 100.

The first contact layer 101 includes, as an example, a GaAs-based compound semiconductor of the first conductivity type. As illustrated in FIGS. 3 to 5, the first contact layer 101 is shared by the plurality of surface emitting laser elements 100 in the element arrangement area EA and the adjacent area AA.

As illustrated in FIG. 5, a contact hole CH3 for electrode extraction is formed in the insulating film 109 covering a portion between the mesa structure MS1 and the mesa structure MS2 adjacent to each other in the multilayer structure. In the contact hole CH3, an anode electrode 112 is disposed so as to be in contact with the first contact layer 101.

The anode electrode 112 is electrically connected to the electrode 111 provided at the top of the mesa structure MS2 via a coupling layer 113.

The coupling layer 113 is, for example, an Au plating layer.

The anode electrode 112 may have a single layer structure or a multilayer structure.

The anode electrode 112 contains, for example, at least one type of metal (including an alloy) selected from a group including Au, Ag, Pd, Pt, Ni, Ti, V, W, Cr, Al, Cu, Zn, Sn, and In.

In a case where the anode electrode 112 has a multilayer structure, the anode electrode 112 contains a material such as, for example, Ti/Au, Ti/Al, Ti/Al/Au, Ti/Pt/Au, Ni/Au, Ni/Au/Pt, Ni/Pt, Pd/Pt, or Ag/Pd.

The first multilayer film reflector 102 is, as an example, a semiconductor multilayer film reflector. The multilayer film reflector is also referred to as a distributed Bragg reflector. A semiconductor multilayer film reflector which is a type of multilayer film reflector (the distributed Bragg reflector) has low light absorption, high reflectance, and conductivity. The first multilayer film reflector 102 is also referred to as a lower DBR.

The first multilayer film reflector 102 is, as an example, a semiconductor multilayer film reflector of the first conductivity type, and has a structure in which a plurality of types (for example, two types) of semiconductor layers (refractive index layers) having different refractive indexes are alternately layered with an optical thickness of ¼ ($\lambda/4$) of an oscillation wavelength A. Each refractive index layer of the first multilayer film reflector 102 includes, for example, an AlGaAs-based compound semiconductor of the first conductivity type.

Inside the first multilayer film reflector 102 of the mesa structure MS1, a current constriction layer 103 is disposed (see FIG. 3). As an example, the current constriction layer 103 includes a non-oxidized area 103*a* containing AlAs, and an oxidized area 103*b* containing an oxide of AlAs (for example, $Al_2O_3$) and surrounding the non-oxidized area.

Inside the first multilayer film reflector 102 of the mesa structure MS2, an oxide constriction layer 103' is disposed (see FIG. 4). The oxide constriction layer 103' has a configuration substantially similar to the current constriction layer 103.

The first spacer layer 104 includes an AlGaAs-based compound semiconductor of the first conductivity type. The "spacer layer" is also referred to as a "clad layer".

The active layer 105 has a quantum well structure including a barrier layer including, for example, an AlGaAs-based compound semiconductor, and a quantum well layer. This quantum well structure may be a single quantum well structure (QW structure) or a multiple quantum well structure (MQW structure).

The second spacer layer 106 (an upper spacer layer) includes an AlGaAs-based compound semiconductor of a second conductivity type. The "spacer layer" is also referred to as a "clad layer".

The second multilayer film reflector 107 is, as an example, a semiconductor multilayer film reflector of the second conductivity type, and has a structure in which a plurality of types (for example, two types) of semiconductor layers (refractive index layers) having different refractive indexes are alternately layered with an optical thickness of ¼ wavelength of the oscillation wavelength. Each refractive index layer of the second multilayer film reflector 107 includes, for example, an AlGaAs-based compound semiconductor of the second conductivity type.

The second contact layer 108 of each of the surface emitting laser elements 100 includes, for example, a GaAs-based compound semiconductor of the second conductivity type.

The cathode electrode 110 of each of the surface emitting laser elements 100 may have a single layer structure or a multilayer structure.

The cathode electrode 110 is joined to the driver unit 20 via the first bump BP1.

The cathode electrode 110 contains, for example, at least one type of metal (including an alloy) selected from a group including Au, Ag, Pd, Pt, Ni, Ti, V, W, Cr, Al, Cu, Zn, Sn, and In.

In a case where the cathode electrode 110 has a multilayer structure, the cathode electrode 110 contains a material such as, for example, Ti/Au, Ti/Al, Ti/Al/Au, Ti/Pt/Au, Ni/Au, Ni/Au/Pt, Ni/Pt, Pd/Pt, or Ag/Pd.

The electrode 111 may have a single layer structure or a multilayer structure.

As illustrated in FIG. 4, the electrode 111 is joined to the driver unit 20 via a plurality of second bumps BP2.

The electrode 111 contains, for example, at least one type of metal (including an alloy) selected from a group including Au, Ag, Pd, Pt, Ni, Ti, V, W, Cr, Al, Cu, Zn, Sn, and In.

In a case where the electrode 111 has a multilayer structure, the electrode 111 contains a material such as, for example, Ti/Au, Ti/Al, Ti/Al/Au, Ti/Pt/Au, Ni/Au, Ni/Au/Pt, Ni/Pt, Pd/Pt, or Ag/Pd.

(Driver Unit)

The driver unit 20 controls the plurality of surface emitting laser elements 100 of the element unit 10. The driver unit 20 causes at least some of the plurality of surface emitting laser elements 100 to emit light by independently driving the plurality of surface emitting laser elements 100. The driver unit 20 drives, for example, at least some of the surface emitting laser elements 100 selected by a system controller 30 to be described later among the plurality of surface emitting laser elements 100.

As illustrated in FIG. 2, the driver unit 20 includes a semiconductor board 21 (for example, Si board) on which a driver IC is formed, and a wiring layer 22 layered on the semiconductor board 21.

As an example, the driver IC includes an NMOS driver that controls a voltage applied to the element unit 10. This NMOS driver generates a drive pulse for performing light emission/extinction of the plurality of surface emitting laser elements 100 of the element unit 10. This NMOS driver is electrically connected to the element unit 10 via the wiring layer 22.

The wiring layer 22 is joined to the plurality of surface emitting laser elements 100 via the plurality of first bumps BP1, and joined to the adjacent area AA via the plurality of second bumps BP2.

The wiring layer 22 includes, for example, a plurality of metal layers **22*a* and a plurality of connection pads 22*d* in an insulating layer 22*b***.

The plurality of metal layers **22*a* electrically connects the NMOS driver in the semiconductor board 21 and the plurality of connection pads 22*d***.

The plurality of connection pads **22*d* is arranged at positions facing the element unit 10 in the wiring layer 22, is electrically connected to the element arrangement area EA via the plurality of first bumps BP1, and is electrically connected to the adjacent area AA via the plurality of second bumps BP2**.

A plurality of connection pads **22*c* is disposed at positions not facing the element unit 10 in the wiring layer 22, and is electrically connected to, for example, a bonding wire 44 described later. Note that an electrical connection mode between the element unit 10 and the driver unit 20 is not limited to that illustrated in FIG. 2**.

(Bump)

The plurality of first bumps BP1 and the plurality of second bumps BP2 include a conductive material that can be shifted from a softened state (a relatively soft state) to a cured state (a relatively hard state) at a time of joining.

The conductive material is preferably a conductive material that becomes difficult to be crushed by pressurization.

Specifically, the conductive material may be, for example, metal particle paste. The metal particle paste can be gradually shifted from the softened state to the cured state by pressurization. Moreover, the metal paste can be solidified by sintering. Examples of the metal particle paste include Au particle paste, Ag particle paste, Cu particle paste, and the like.

The metal particle paste is preferably metal nano paste containing metal nanoparticles. In the metal nano paste, metal particles containing metal nanoparticles having a particle size of less than 1 μm are dispersed in a resin binder. Examples of the metal nano paste include Au nano paste, Ag nano paste, Cu nano paste, and the like.

The conductive material may be, for example, alloy paste. The alloy paste may be, for example, solder paste (cream solder). The solder paste has a property (thixotropy) in which a viscosity decreases (becomes the softened state) when stirred, and the viscosity returns to the original state (the cured state) when left to stand. Specific examples of the solder paste include Sn—Ag-based solder paste, Sn—Au-based solder paste, Sn—Cu-based solder paste, and the like.

The plurality of second bumps BP2 is arranged at a higher density than the plurality of first bumps BP1.

That is, an amount (an area density) per unit area of the plurality of second bumps BP2 is larger than that of the plurality of first bumps BP1.

For example, in a case where a size of the second bump BP2 is smaller than a size of the first bump BP1, an interval between the adjacent second bumps BP2 is preferably an interval less than an interval between the adjacent first bumps BP1, in which an area density of the plurality of second bumps BP2 is preferably higher than an area density of the plurality of first bumps BP1.

For example, in a case where the size of the second bump BP2 is equal to or larger than the size of the first bump BP1, the interval between the adjacent second bumps BP2 may be less than the interval between the adjacent first bumps BP1.

For example, in a case where the size of the second bump BP2 is equal to or larger than the size of the first bump BP1, the interval between the adjacent second bumps BP2 may be an interval equal to or more than the interval between the adjacent second bumps BP1, in which the area density of the plurality of second bumps BP2 may be higher than the area density of the plurality of first bumps BP1.

Here, as an example, as illustrated in FIG. 2, the sizes of the first and second bumps BP1 and BP2 are the same, and the interval between the adjacent second bumps BP2 is less than the interval between the adjacent first bumps BP1.

An arrangement density of the plurality of second bumps BP2 is preferably higher than an arrangement density of the plurality of surface emitting laser elements 100.

That is, an amount (an area density) per unit area of the plurality of second bumps BP2 is preferably larger than that of the plurality of surface emitting laser elements 100.

Figure 6:
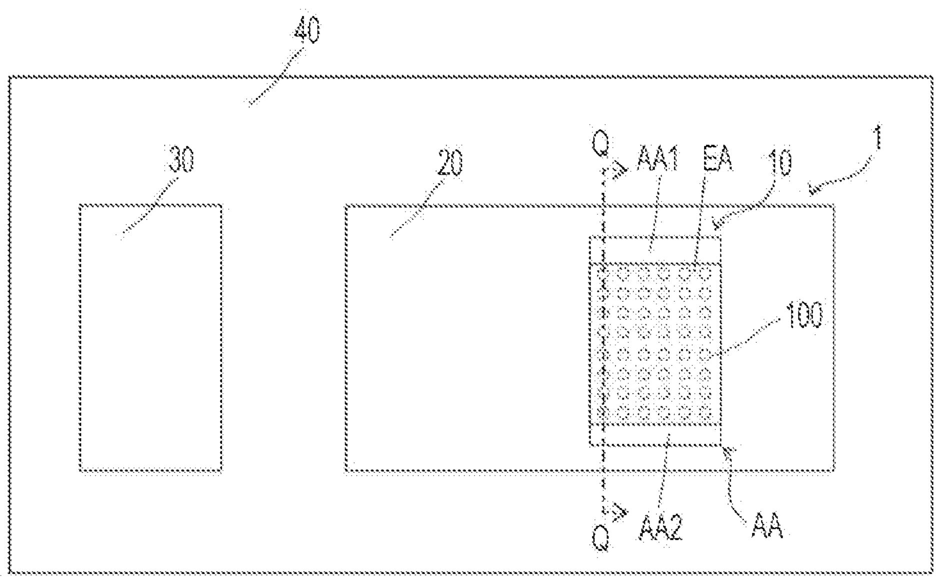
FIG. 6 is a plan view illustrating a state in which the surface emitting laser device of FIG. 1 is mounted on a printed wiring board.

FIG. 6 is a plan view illustrating an example in which the driver unit 20 of the surface emitting laser device 1 is mounted on a printed wiring board 40. The printed wiring board 40 is provided with, for example, the system controller 30 in addition to the surface emitting laser device 1.

Figure 7:
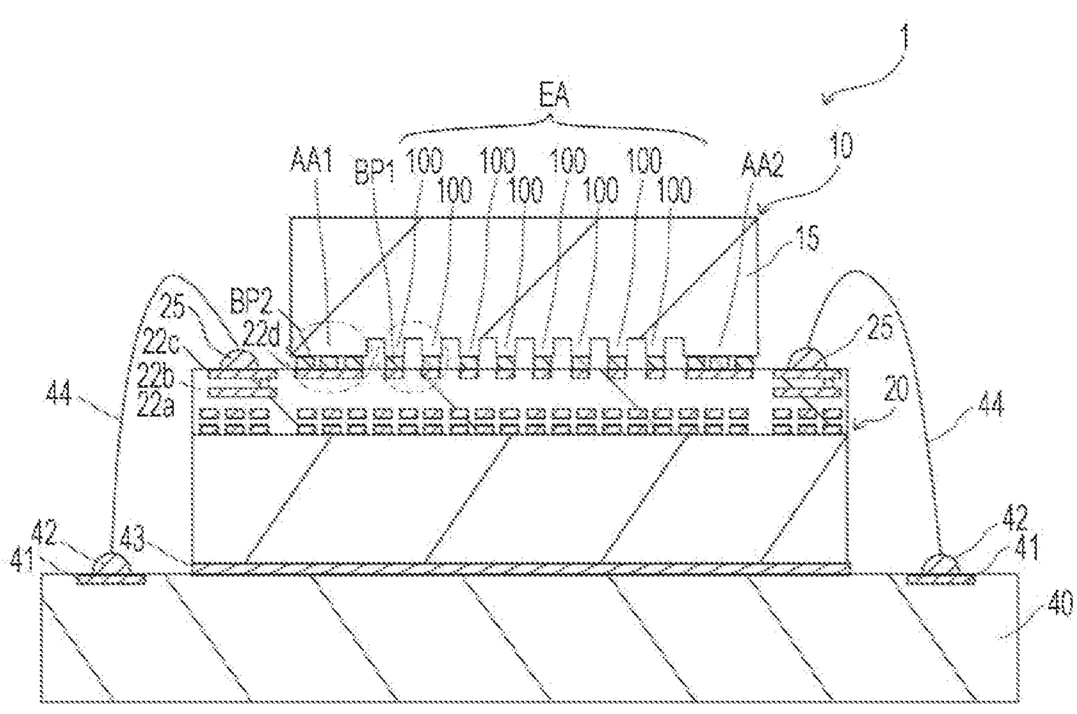
FIG. 7 is a cross-sectional view taken along line Q-Q in FIG. 6.

FIG. 7 is a cross-sectional view taken along line Q-Q in FIG. 6. Between the driver unit 20 and the printed wiring board 40, a joining layer 43 is provided. The joining layer 43 fixes the driver unit 20 and the printed wiring board 40 to each other. The joining layer 43 includes, for example, an insulating resin material.

The driver unit 20 and the printed wiring board 40 are electrically connected by the bonding wire 44. One end of the bonding wire 44 is fixed to the connection pad 22*c* of the driver unit 20 by solder 25, and another end of the bonding wire 44 is fixed to the connection pad 41 of the printed wiring board 40 by solder 42.

2. <Operation of Surface Emitting Laser Device According to One Embodiment of Present Technology>

In the surface emitting laser device 1, a current is supplied from the printed wiring board 40 to the driver IC formed on the semiconductor board 21 of the driver unit 20, via the bonding wire 44 and the wiring layer 22 of the driver unit 20. As a result, the driver IC operates, and a current is injected into the anode electrode 112 via the wiring layer 22, the plurality of second bumps BP2, the adjacent area AA, and the coupling layer 113. The current injected into the anode electrode 112 is supplied to the mesa structure MS1 of the surface emitting laser element 100 as a light-emitting target, via the first contact layer 101. The current supplied to the mesa structure MS1 is injected into the active layer 105 via the first multilayer film reflector 102, the current constriction layer 103, and the first spacer layer 104 of the mesa structure MS1. As a result, when the active layer 105 emits light, the light is amplified while being repeatedly reflected between the first and second multilayer film reflectors 102 and 107, and an oscillation condition is satisfied, the light is emitted from the board 15 as laser light.

3. <Manufacturing method for surface emitting laser device according to one embodiment of present technology>

Figure 8:
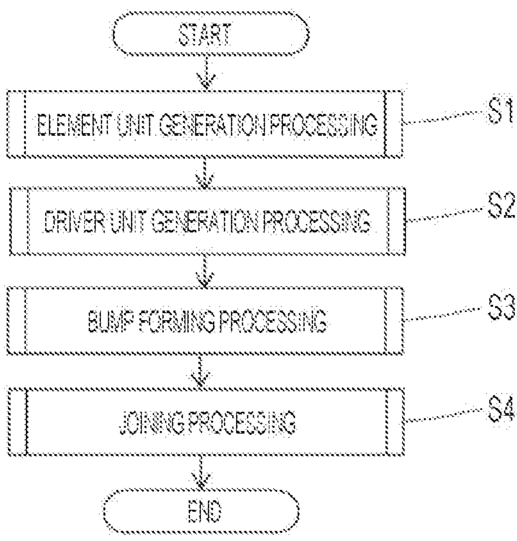
FIG. 8 is a flowchart for explaining a manufacturing method for the surface emitting laser device in FIG. 1.

Hereinafter, a manufacturing method for a surface emitting laser device 1 according to one embodiment will be described with reference to FIGS. 8, 9, 10, 11, 12, 13, 14, 15, 16, 17, 18, 19, 20A, 20B, 21, 22, 23, 24, 25, 26, 27, 28, 29, 30, 31, and 32. FIG. 8 is a flowchart for explaining a manufacturing method for the surface emitting laser device 1.

In the first step S1, element unit generation processing is performed. Details of the element unit forming step will be described later.

In the next step S2, driver unit generation processing is performed. Note that, in a case where an existing driver unit 20 can be prepared, step S2 (the driver unit generation processing) may be omitted.

In the next step S3, bump forming processing is performed. Details of the bump forming processing will be described later.

In the final step S4, joining processing is performed. Details of the joining processing will be described later.

(Element Unit Generation Processing)

Figure 9:
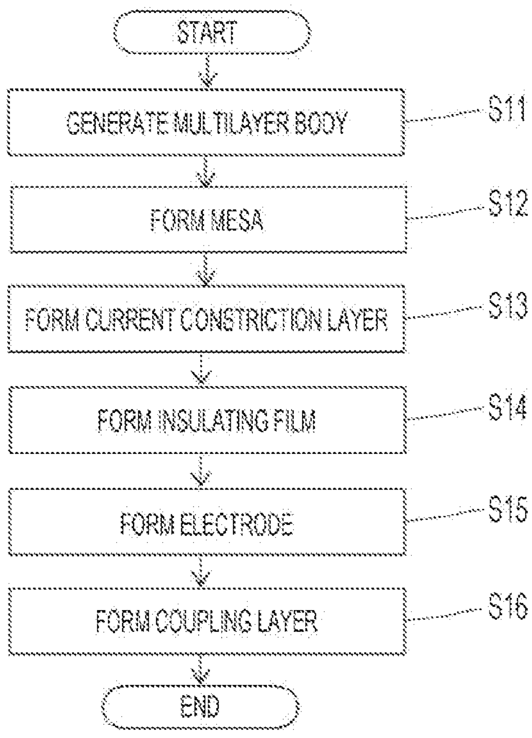
FIG. 9 is a flowchart for explaining element unit generation processing in FIG. 8.
Figure 10:
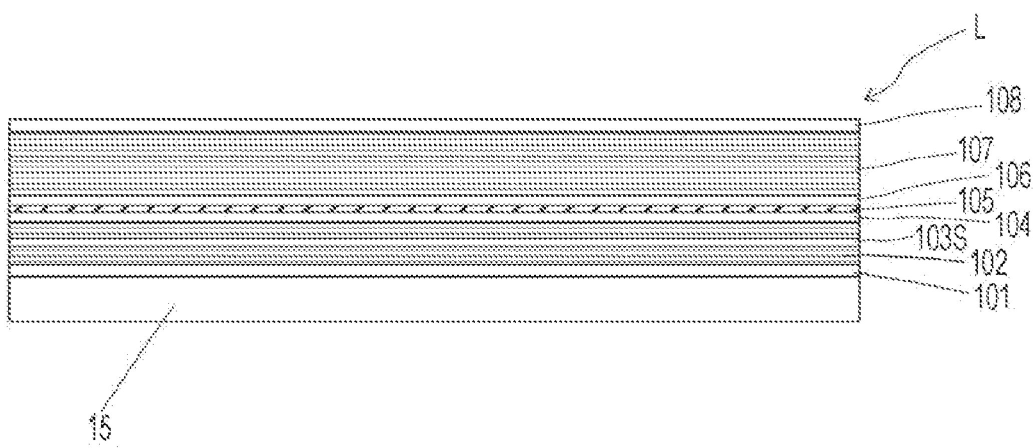
FIG. 10 is a cross-sectional view (part 1) illustrating the element unit generation processing of FIG. 8 for each step.

Hereinafter, the element unit generation processing (step S1 in FIG. 8) will be described with reference to a flowchart in FIG. 9 and cross-sectional views in FIGS. 10, 11, 12, 13, 14, 15, 16, 17, 18, 19, 20A, and 20B.

Here, as an example, a plurality of element units 10 is simultaneously generated on one wafer which is a base material of the board 15, by a semiconductor manufacturing method. Next, the plurality of element units 10 integrated in series is separated from each other by dicing to obtain a plurality of element units 10 for each unit (for each chip).

In the first step S11, a multilayer body L is generated. Specifically, by using a chemical vapor deposition (CVD) method, for example, a metal organic chemical vapor deposition (MOCVD) method, the multilayer body L is generated by layering the first contact layer 101, the first multilayer film reflector 102, the first spacer layer 104, the active layer 105, the second spacer layer 106, the second multilayer film reflector 107 internally including a selectively oxidized layer 103S, and the second contact layer 108 in this order on the board 15 (see FIG. 10).

In the next step S12, a mesa is formed.

Figure 11:
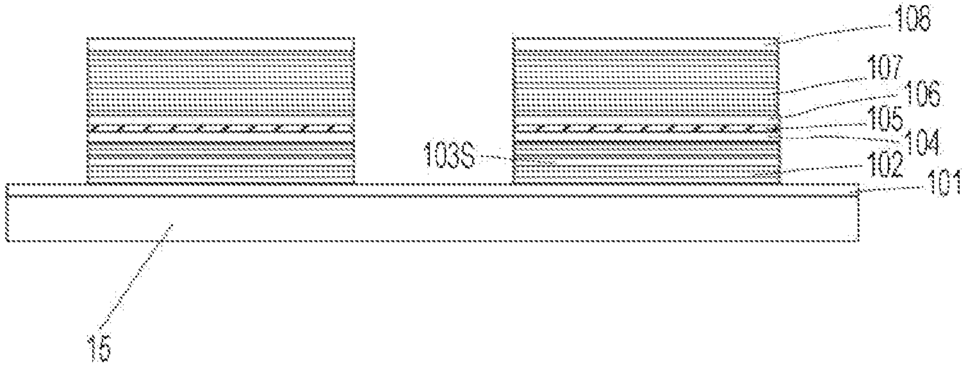
FIG. 11 is a cross-sectional view (part 2) illustrating the element unit generation processing of FIG. 8 for each step.
Figure 12:
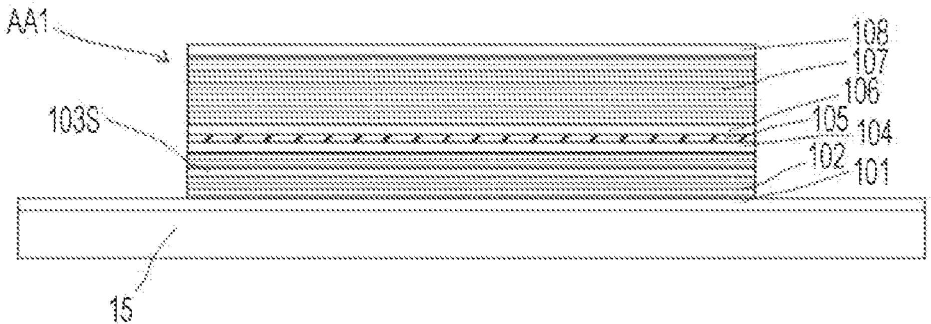
FIG. 12 is a cross-sectional view (part 3) illustrating the element unit generation processing of FIG. 8 for each step.

Specifically, the multilayer body L is etched to form a mesa (see FIGS. 11 and 12).

More specifically, first, a resist pattern for forming mesas to be the mesa structures MS1 and MS2 is generated on the second contact layer 108 of the multilayer body L. Next, the mesa is formed by etching (for example, wet etching using a sulfuric acid-based etchant) on the multilayer body L by using this resist pattern as a mask. Here, etching is performed until the first contact layer 101 is exposed. Thereafter, the resist pattern is removed.

In the next step S13, the current constriction layer 103 is formed.

Figure 13:
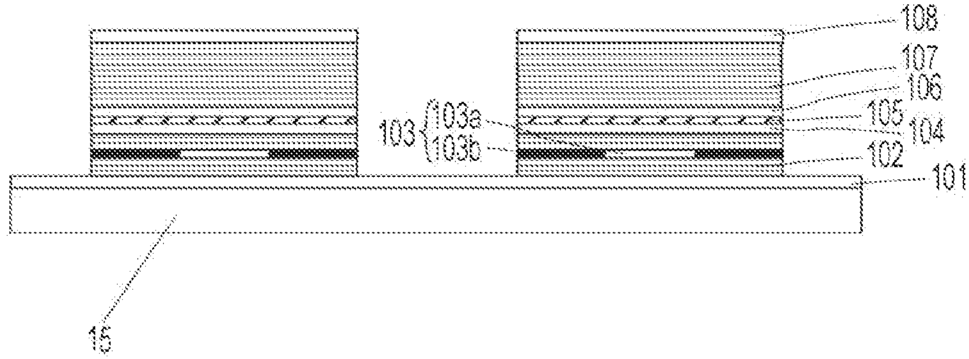
FIG. 13 is a cross-sectional view (part 4) illustrating the element unit generation processing of FIG. 8 for each step.
Figure 14:
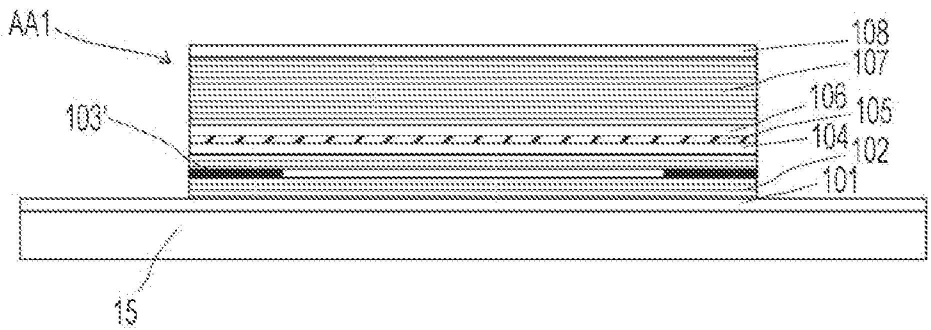
FIG. 14 is a cross-sectional view (part 5) illustrating the element unit generation processing of FIG. 8 for each step.

Specifically, the current constriction layer 103 is generated by oxidizing a peripheral portion of the selectively oxidized layer 103S of the mesa (see FIG. 13). At this time, the oxide constriction layer 103' is also formed at the same time.

Specifically, by exposing the mesa to a water vapor atmosphere to oxidize (selectively oxidize) the selectively oxidized layer 103S from a side surface, the current constriction layer 103 and the oxide constriction layer 103' are formed in which a non-oxidized area is surrounded by an oxidized area.

In the next step S14, the insulating film 109 is formed.

Figure 15:
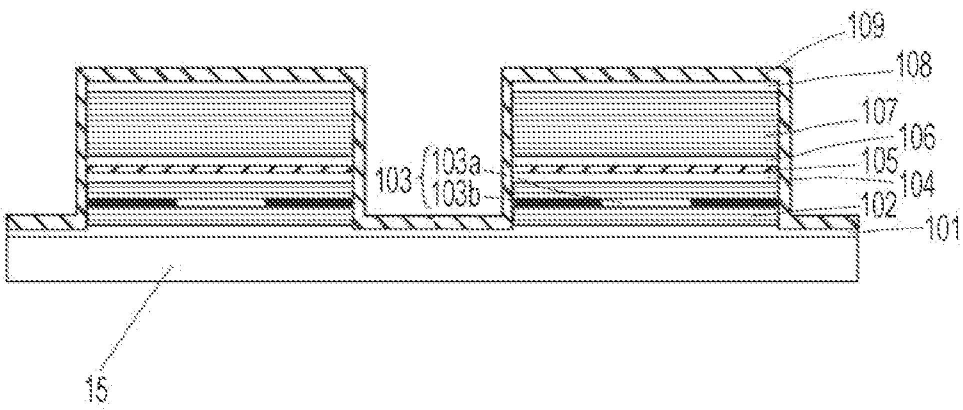
FIG. 15 is a cross-sectional view (part 6) illustrating the element unit generation processing of FIG. 8 for each step.
Figure 16:
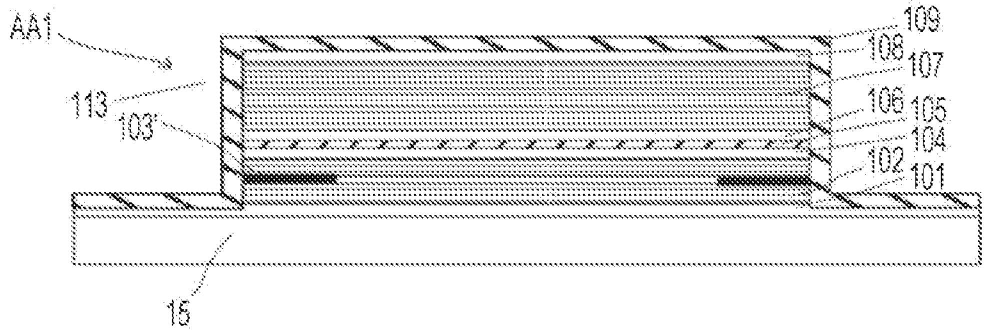
FIG. 16 is a cross-sectional view (part 7) illustrating the element unit generation processing of FIG. 8 for each step.
Figure 17:
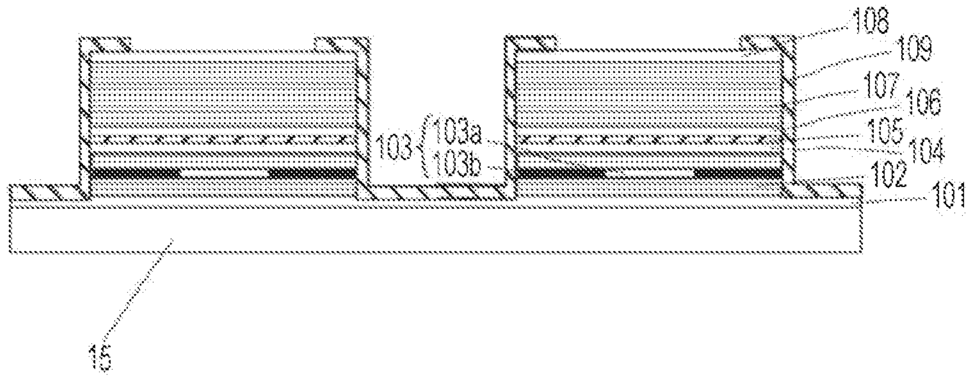
FIG. 17 is a cross-sectional view (part 9) illustrating the element unit generation processing of FIG. 8 for each step.
Figure 18:
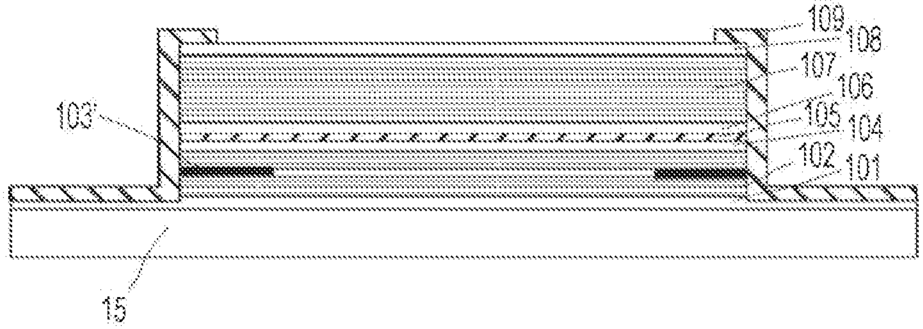
FIG. 18 is a cross-sectional view (part 10) illustrating the element unit generation processing of FIG. 8 for each step.
Figure 19:
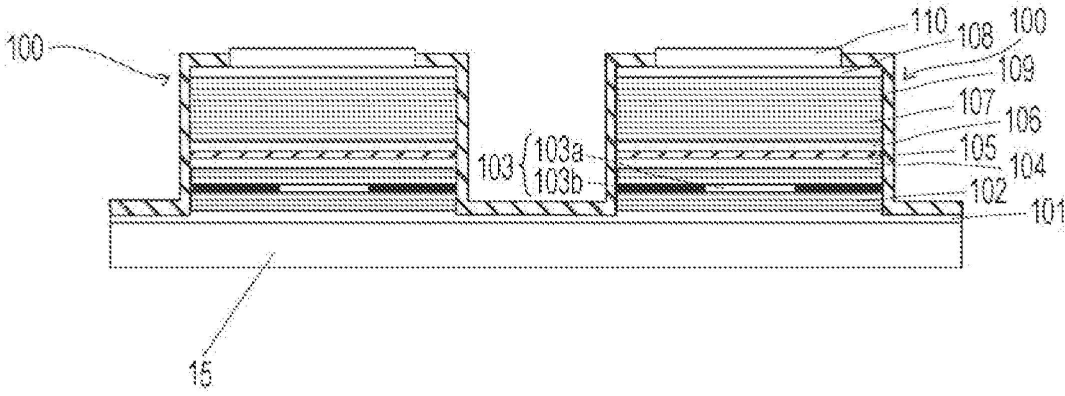
FIG. 19 is a cross-sectional view (part 11) illustrating the element unit generation processing of FIG. 8 for each step.

Specifically, the insulating film 109 is formed on the multilayer body in which the mesa is formed (see FIGS. 15 and 16).

In the next step S15, an electrode is formed.

Specifically, first, the insulating film 109 is formed, and a resist pattern for forming the cathode electrode 110, the electrode 111, and the anode electrode 112 is generated on the multilayer body in which the mesa is formed. Next, using this resist pattern as a mask, the insulating film 109 at a portion where the cathode electrode 110, the electrode 111, and the anode electrode 112 are to be provided is removed by etching (for example, etching using a hydrofluoric acid-based etchant) (see FIGS. 17 and 18). Next, for example, an Au/Ti film is formed on the multilayer body with the etched insulating film 109 by, for example, an EB vapor deposition method, and the cathode electrode 110, the electrode 111, and the anode electrode 112 are formed by lifting off the resist and, for example, Au/Ti on the resist (see FIG. 19 and FIG. 20A).

In the next step S16, the coupling layer 113 is formed.

Figure 20A:
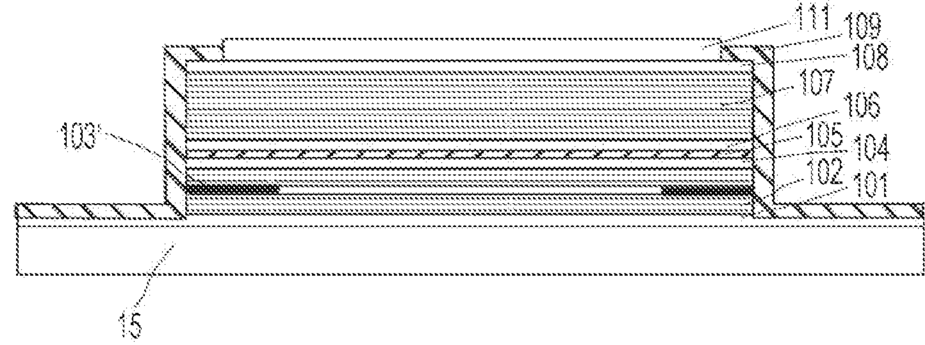
FIG. 20A is a cross-sectional view (part 12) illustrating the element unit generation processing of FIG. 8 for each step.
Figure 20B:
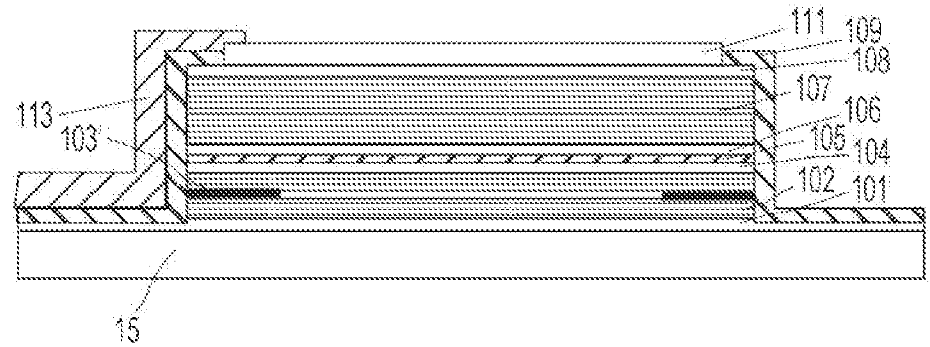
FIG. 20B is a cross-sectional view (part 13) illustrating the element unit generation processing of FIG. 8 for each step.

Specifically, for example, the coupling layer 113 that connects the electrode 111 and the anode electrode 112 is formed using a plating method (see FIG. 20B).

Note that, before the plating method is used, a backing layer to be a plating seed is formed at a portion of the insulating film 109 where the coupling layer 113 is to be formed, for example, by vapor deposition, sputtering, or the like. A thickness of the coupling layer 113 is a thickness (for example, about 2 μm) that can sufficiently prevent a voltage drop.

Thereafter, processing such as annealing, thinning by polishing a back surface of the wafer, and non-reflection coating on the back surface of the wafer is performed, and a plurality of element units 10 is formed on one wafer. Thereafter, the plurality of element units 10 is separated for each unit (for each chip) by dicing.

(Bump Forming Processing)

Figure 21:
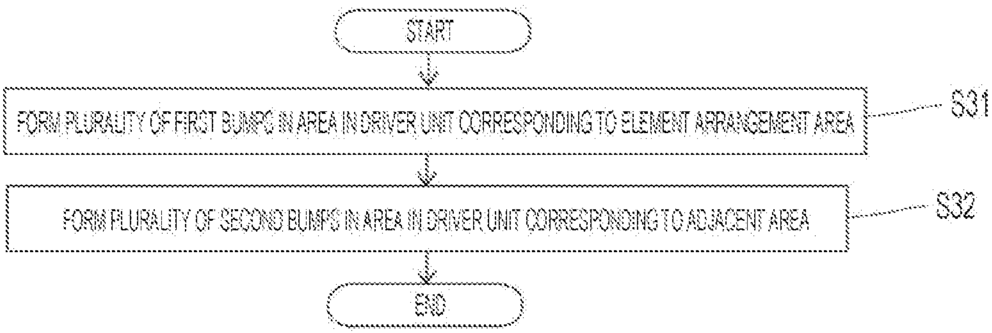
FIG. 21 is a flowchart for explaining bump forming processing of FIG. 8.

Hereinafter, the bump forming processing (step S3 in FIG. 8) will be described with reference to a flowchart in FIG. 21 and a cross-sectional view in FIG. 22.

Figure 22:
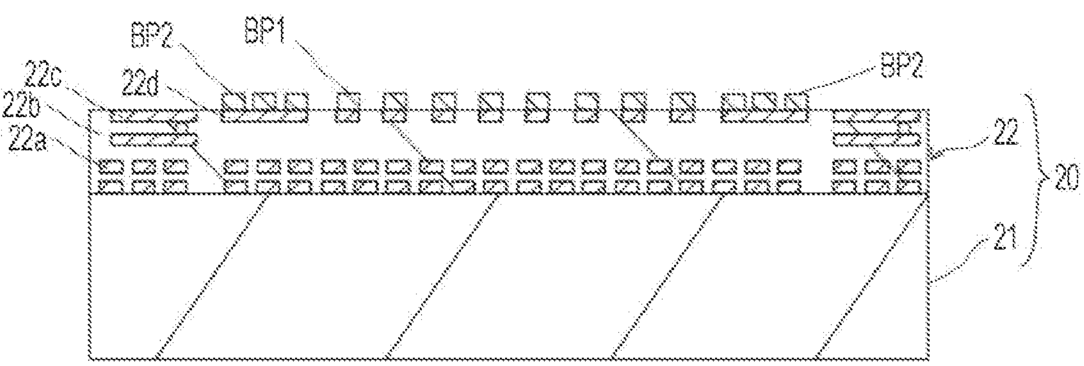
FIG. 22 is a cross-sectional view for explaining the bump forming processing of FIG. 8.

In the first step S31, a plurality of first bumps BP1 is formed in an area in the driver unit 20 corresponding to the element arrangement area EA (see FIG. 22).

Specifically, the first bump BP1 in the softened state is attached to a portion of the driver unit 20 that is to be joined to each of the surface emitting laser elements 100 of the element unit 10.

Note that, for example, in a case where the first bump BP1 is solder paste, the solder paste is stirred in advance in the cured state to be in the softened state.

In final step S32, a plurality of second bumps BP2 is formed in an area in the driver unit 20 corresponding to the adjacent area AA (see FIG. 22).

Specifically, the plurality of second bumps BP2 in the softened state is attached to a portion that is to be joined to the first adjacent area AA1 of the adjacent area AA of the element unit 10 and a portion that is to be joined to the second adjacent area AA2 in the driver unit 20.

At this time, the plurality of second bumps BP2 is arranged at a higher density than the plurality of first bumps BP1 (preferably, a higher density than an arrangement density of the plurality of surface emitting laser elements 100).

Note that, for example, in a case where the second bump BP2 is solder paste, the solder paste is stirred in advance in the cured state to be in the softened state.

The order of steps S31 and S32 described above may be reversed.

(Joining Processing)

Figure 23:
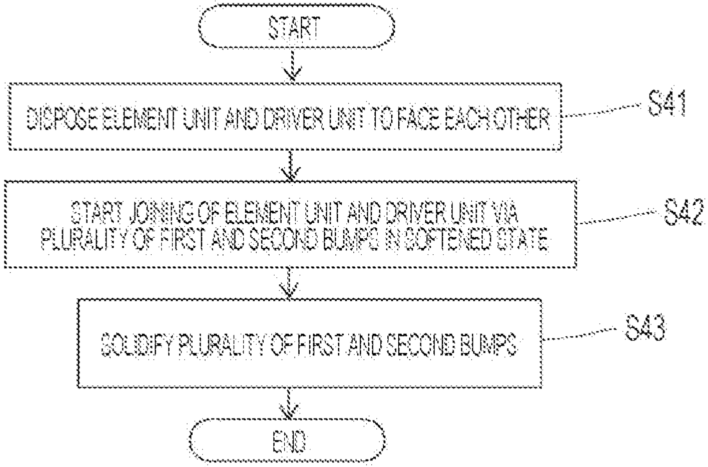
FIG. 23 is a flowchart for explaining joining processing of FIG. 8.

Hereinafter, the joining processing (step S4 in FIG. 8) will be described with reference to a flowchart in FIG. 23 and cross-sectional views in FIGS. 24 to 32.

Figure 24:
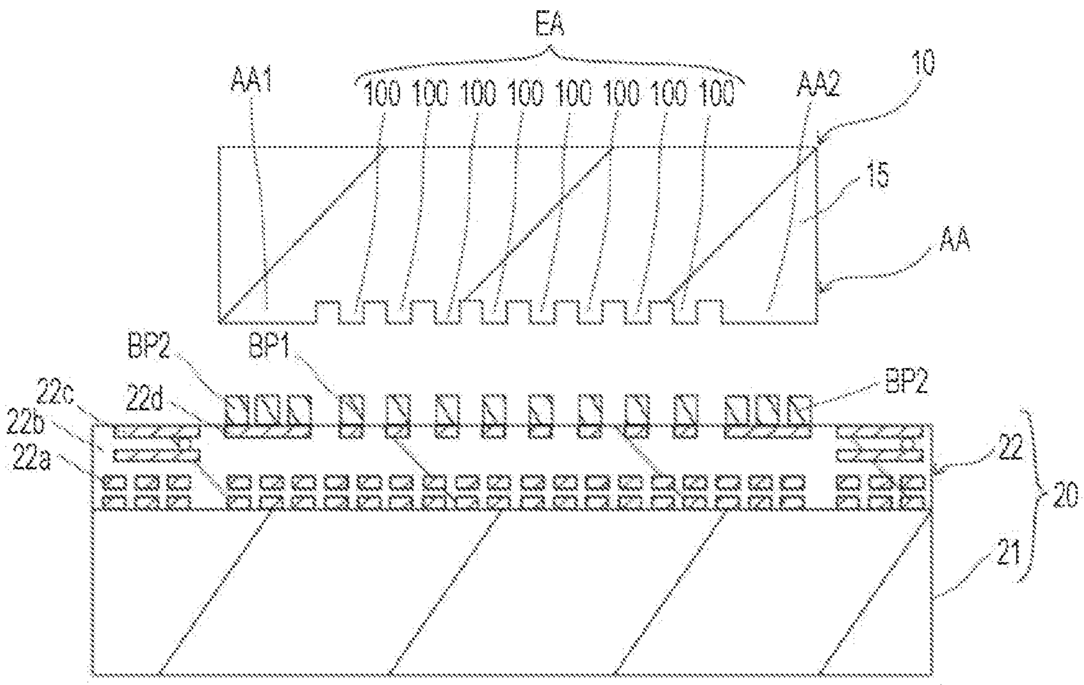
FIG. 24 is a cross-sectional view (part 1) illustrating the joining processing of FIG. 8 for each step.
Figure 26:
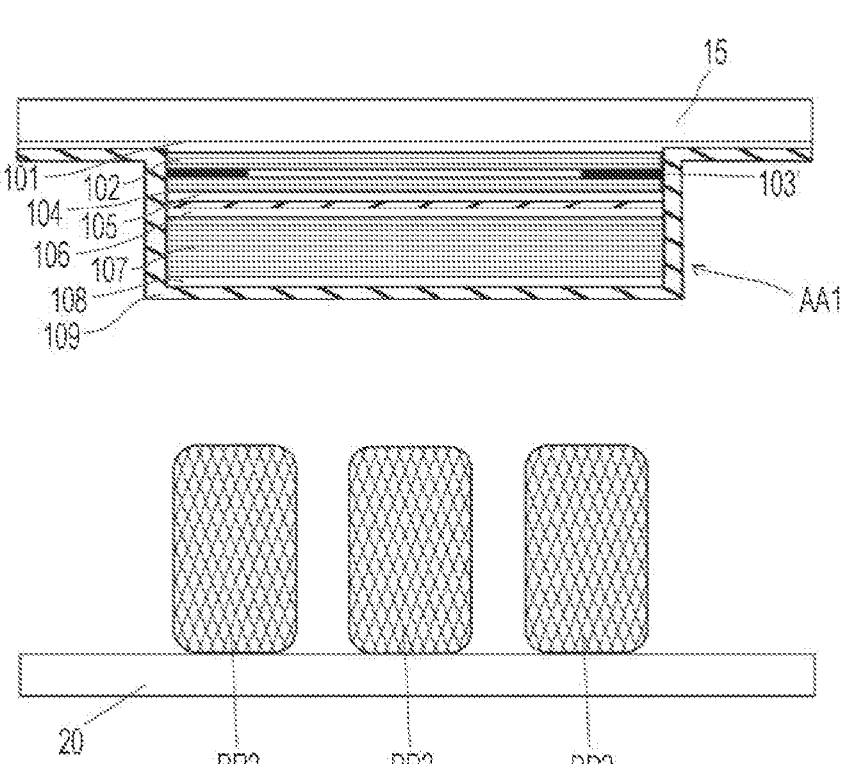
FIG. 26 is a partially enlarged view (part 2) of FIG. 24.

In first step S41, the element unit 10 and the driver unit 20 are disposed to face each other (see FIG. 24).

Specifically, the element units 10 and the driver unit 20 are disposed to face each other (see FIGS. 25 and 26) such that the element arrangement area EA of the element unit 10 faces an area where the plurality of first bumps BP1 in the softened state is formed in the driver unit 20, and the adjacent area AA of the element unit 10 faces an area where the plurality of second bumps BP2 in the softened state is formed in the driver unit 20.

More specifically, for example, while a manipulator is suctioning and holding the element units 10, with respect to the driver unit 20 placed on a base, the element units 10 and the driver unit 20 are disposed to face each other such that each of the surface emitting laser elements 100 faces the corresponding first bump BP1 in the softened state (see FIG. 25), the first adjacent area AA1 faces the plurality of corresponding second bumps BP2 in the softened state (see FIG. 26), and the second adjacent area AA2 faces the plurality of corresponding second bumps BP2 in the softened state.

Figure 27:
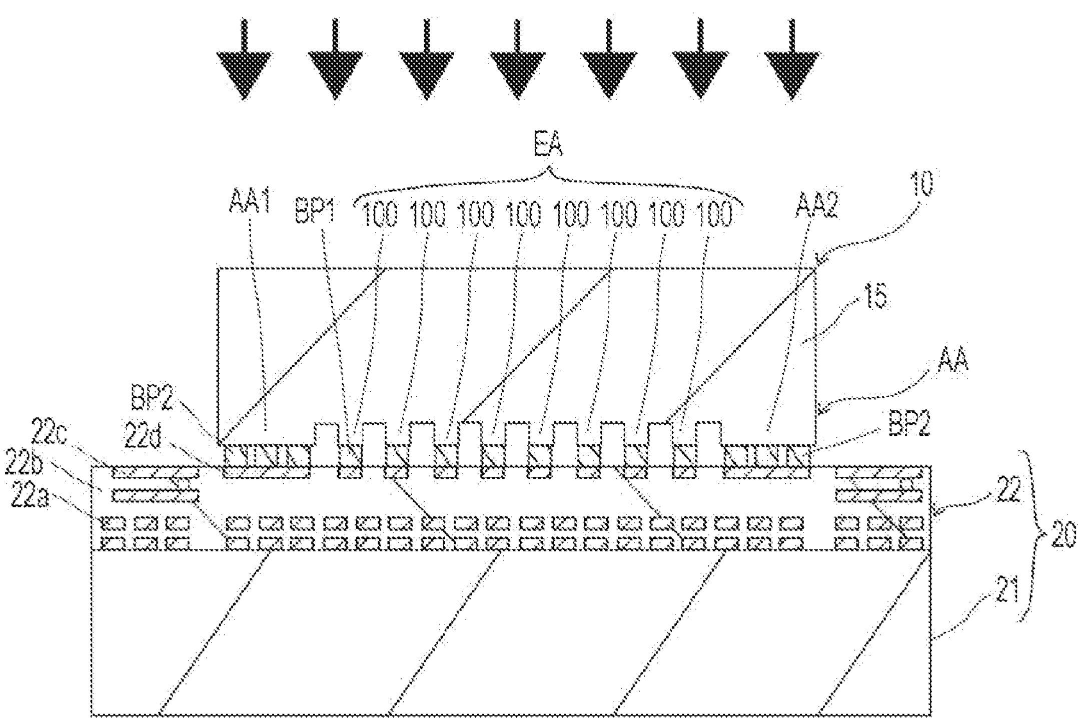
FIG. 27 is a cross-sectional view (part 2) illustrating the joining processing of FIG. 8 for each step.

In the next step S42, joining is started between the element unit 10 and the driver unit 20 via the plurality of first and second bumps BP1 and BP2 in the softened state (see FIG. 27).

Figure 28:
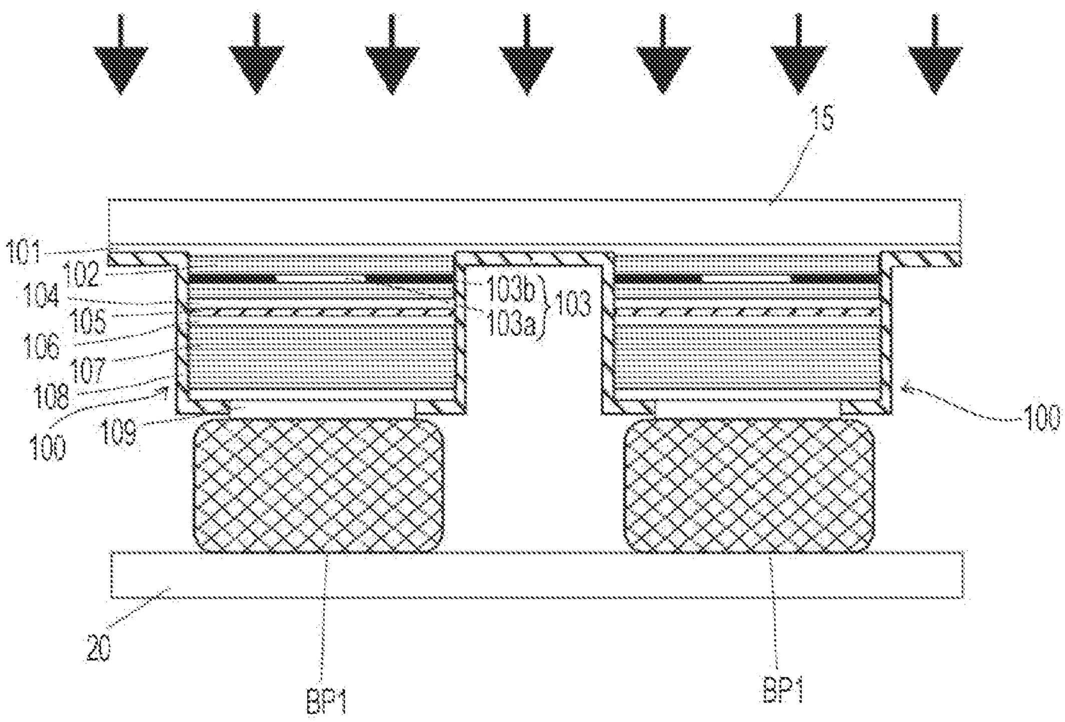
FIG. 28 is a partially enlarged view (part 1) of FIG. 27.
Figure 29:
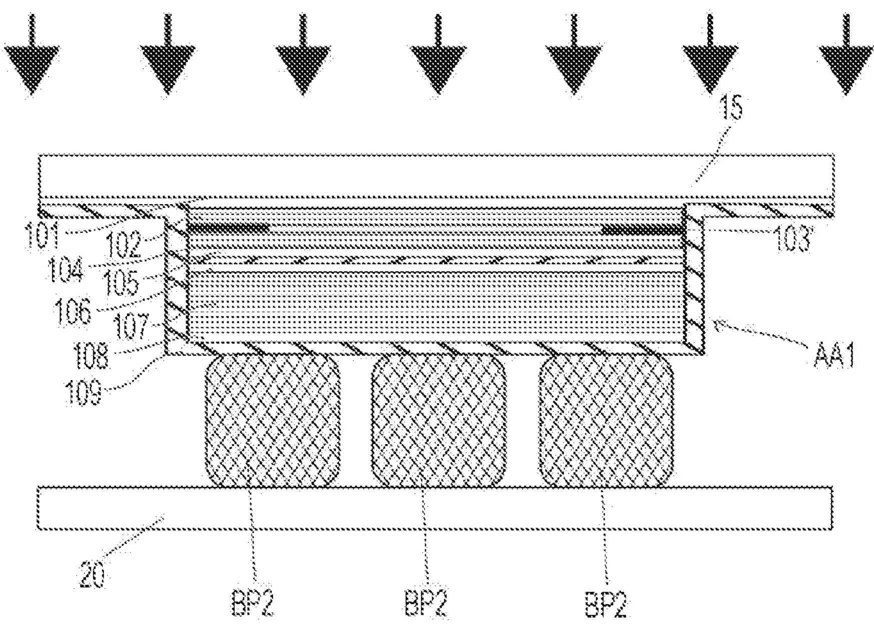
FIG. 29 is a partially enlarged view (part 2) of FIG. 27.

Specifically, under a predetermined temperature condition, the element unit 10 suctioned and held by the manipulator is uniformly pressed (pressurized) against the plurality of first and second bumps BP1 and BP2 in the softened state formed in the driver unit 20 placed on the base, at a predetermined pressure (see FIGS. 27 to 29). At this time, the plurality of first bumps BP1 and the plurality of second bumps BP2 are crushed. The plurality of first bumps BP1 and the plurality of second bumps BP2 gradually shift to the cured state in the process of being crushed.

Figure 30:
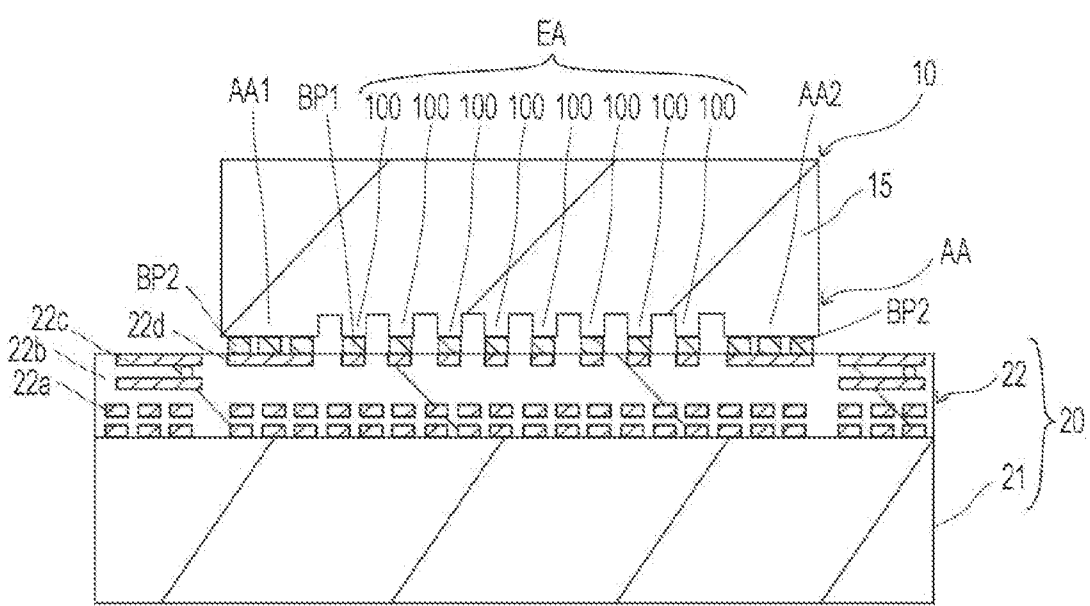
FIG. 30 is a cross-sectional view (part 3) illustrating the joining processing of FIG. 8 for each step.
Figure 31:
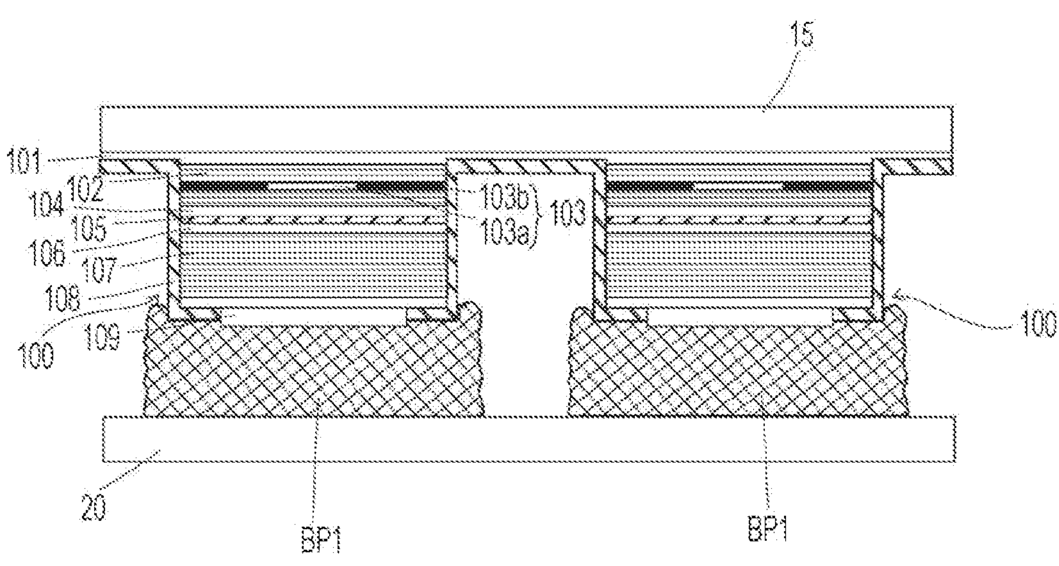
FIG. 31 is a partially enlarged view (part 1) of FIG. 30.
Figure 32:
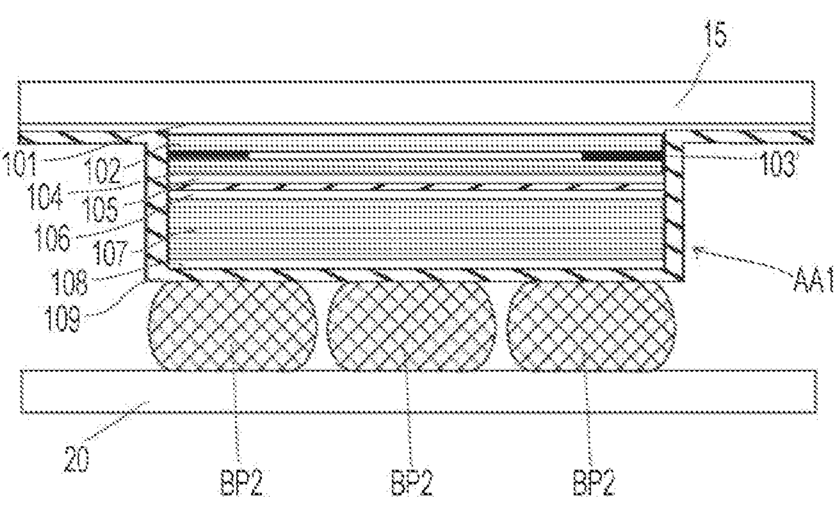
FIG. 32 is a partially enlarged view (part 2) of FIG. 30.

In the final step S43, the plurality of first and second bumps BP1 and BP2 is solidified (see FIGS. 30 to 32).

Specifically, for example, in a case where the plurality of first and second bumps BP1 and BP2 is metal particle paste, the first and second bumps BP1 and BP2 may be heated while being pressurized to be sintered and solidified, or may be sintered in a heating furnace to be solidified (by reflow).

For example, in a case where the plurality of first and second bumps BP1 and BP2 is solder paste, the solder paste is solidified by being left for a predetermined time after an end of stirring.

4. <Effect of Surface Emitting Laser Device and Manufacturing Method Thereof According to One Embodiment of Present Technology>

Hereinafter, effects of a surface emitting laser device and a manufacturing method thereof according to one embodiment of the present technology will be described.

The surface emitting laser device 1 according to one embodiment includes: the element unit 10 including the element arrangement area EA in which a plurality of surface emitting laser elements 100 is arranged and the adjacent area AA adjacent to the element arrangement area EA; the driver unit 20 including a driver IC; a plurality of first bumps BP1 that joins each of the plurality of surface emitting laser elements 100 and the driver unit 20; and a plurality of second bumps BP2 that joins the adjacent area AA and the driver unit 20. Each of the plurality of first bumps BP1 and the plurality of second bumps BP2 contains a conductive material that becomes difficult to be crushed by pressurization, and the plurality of second bumps BP is arranged at a higher density than the plurality of first bumps BP1.

In this case, since the first and second bumps BP1 and BP2 are relatively soft and stress is dispersed at a time of joining of the element unit 10 and the driver unit 20, breakage of the element unit 10 can be suppressed. After the element unit 10 and the driver unit 20 are joined, the first and second bumps BP1 and BP2 become relatively hard, so that sufficient joining strength (joining rigidity) can be obtained.

Moreover, since the second bumps BP are arranged at a higher density than the first bumps BP1, it is possible to suppress variation in interval between the element unit 10 and the driver unit 20 (more specifically, an interval between opposing positions) as a whole, as compared with a case where the second bumps BP2 are arranged at the same density as the first bumps BP1 or at a lower density than the first bumps BP1.

As described above, according to the surface emitting laser device 1 of one embodiment, it is possible to provide the surface emitting laser device capable of suppressing variation in interval between the element unit and the driver unit while suppressing breakage of the element unit. Note that, by suppressing the variation in interval between the element unit and the driver unit, variation in electric resistance between the units can be suppressed.

As a result, according to the surface emitting laser device 1, it is possible to realize a surface emitting laser device that can suppress variation in electrical resistance between the units and can be manufactured at a high yield.

As can be seen from the above description, the configuration of the surface emitting laser device 1 becomes more effective as a mechanical strength of the element unit 10 is lower.

Each of the plurality of surface emitting laser elements 100 has the mesa structure MS1 protruding toward the driver unit 20 side and including the cathode electrode 110 at a top, and the cathode electrode 110 and the driver unit 20 are joined via the first bumps BP1. As a result, the cathode electrode 110 of each of the surface emitting laser elements 100 and the driver unit 20 can be easily and reliably electrically connected.

The conductive material is preferably metal particle paste. As a result, it is possible to ensure curability by pressurization.

The conductive material is preferably metal nano paste. As a result, it is possible to sufficiently secure curability by pressurization.

An arrangement density of the plurality of second bumps BP2 is preferably higher than an arrangement density of the plurality of surface emitting laser elements 100. As a result, it is possible to effectively suppress variation in interval between the element unit 10 and the driver unit 20.

The adjacent area AA includes at least the first and second adjacent areas AA1 and AA2 respectively located on one side and another side sandwiching the element arrangement area EA. As a result, the arrangement density of the second bumps BP2 on both sides sandwiching the element arrangement area EA is high, so that a relative inclination after the element unit 10 and the driver unit 20 are joined can be sufficiently suppressed, and variation in interval between the element unit 10 and the driver unit 20 can be sufficiently suppressed.

The element unit 10 has a multilayer structure including the first and second multilayer film reflectors 102 and 107 and the active layer 105 disposed between the first and second multilayer film reflectors 102 and 107, the element arrangement area EA constitutes a part of the multilayer structure in an in-plane direction, and the adjacent area AA constitutes another part of the multilayer structure in the in-plane direction. As a result, the element arrangement area EA and the adjacent area AA can be formed in parallel in a semiconductor manufacturing step.

The driver unit 20 includes the semiconductor board 21 on which the driver IC is formed, and the wiring layer 22 layered on the semiconductor board 21, and the wiring layer 22 is joined to the plurality of surface emitting laser elements 100 via the plurality of first bumps BP1, and joined to the adjacent area AA via the plurality of second bumps BP2. As a result, it is possible to stably conduct the plurality of surface emitting laser elements 100 and the driver IC.

A manufacturing method for the surface emitting laser device 1 according to one embodiment is a manufacturing method for a surface emitting laser device including: an element unit including an element arrangement area in which a plurality of surface emitting laser elements 100 is arranged and an adjacent area adjacent to the element arrangement area; and a driver unit including a driver IC, and the manufacturing method includes: a joining step of joining each of the plurality of surface emitting laser elements 100 and the driver unit 20 via a plurality of first bumps BP1, and joining the adjacent area AA and the driver unit 20 via a plurality of second bumps BP2. The plurality of first bumps BP1 and the plurality of second bumps BP2 include a conductive material that becomes difficult to be crushed by pressurization, and the plurality of second bumps BP2 is arranged at a higher density than the plurality of first bumps BP1 in the joining step.

In this case, since the first and second bumps BP1 and BP2 are relatively soft and stress is dispersed at a time of joining of the element unit 10 and the driver unit 20, breakage of the element unit 10 can be suppressed. After the element unit 10 and the driver unit 20 are joined, the first and second bumps BP1 and BP2 become relatively hard, so that sufficient joining strength can be obtained.

Moreover, since the second bumps BP are arranged at a higher density than the first bumps BP1, it is possible to suppress variation in interval between the element unit 10 and the driver unit 20 (more specifically, an interval between opposing positions) as a whole, as compared with a case where the second bumps BP2 are arranged at the same density as the first bumps BP1 or at a lower density than the first bumps BP1.

According to the manufacturing method for the surface emitting laser device 1 according to one embodiment, it is possible to provide the surface emitting laser device capable of suppressing variation in interval between the element unit and the driver unit while suppressing breakage of the element unit. Note that, by suppressing the variation in interval between the element unit and the driver unit, variation in electric resistance between the units can be suppressed.

As a result, according to the manufacturing method for the surface emitting laser device 1, it is possible to manufacture a surface emitting laser element capable of suppressing variation in electric resistance between the units at a high yield.

As can be seen from the above description, the manufacturing method for the surface emitting laser device 1 becomes more effective as a mechanical strength of the element unit 10 is lower.

The manufacturing method for the surface emitting laser device 1 further includes: prior to the joining step, a step of arranging the plurality of first bumps BP1 in an area in the driver unit 20 corresponding to the element arrangement area EA; and a step of arranging the plurality of second bumps BP2 in an area in the driver unit 20 corresponding to the adjacent area AA at a density higher than an arrangement density of the plurality of first bumps BP1. As a result, the element unit 10 and the driver unit 20 can be easily joined to each other.

5. <Modification of One Embodiment of Present Technology>

The present technology is not limited to the embodiment described above, and various modifications can be made.

Figure 33:
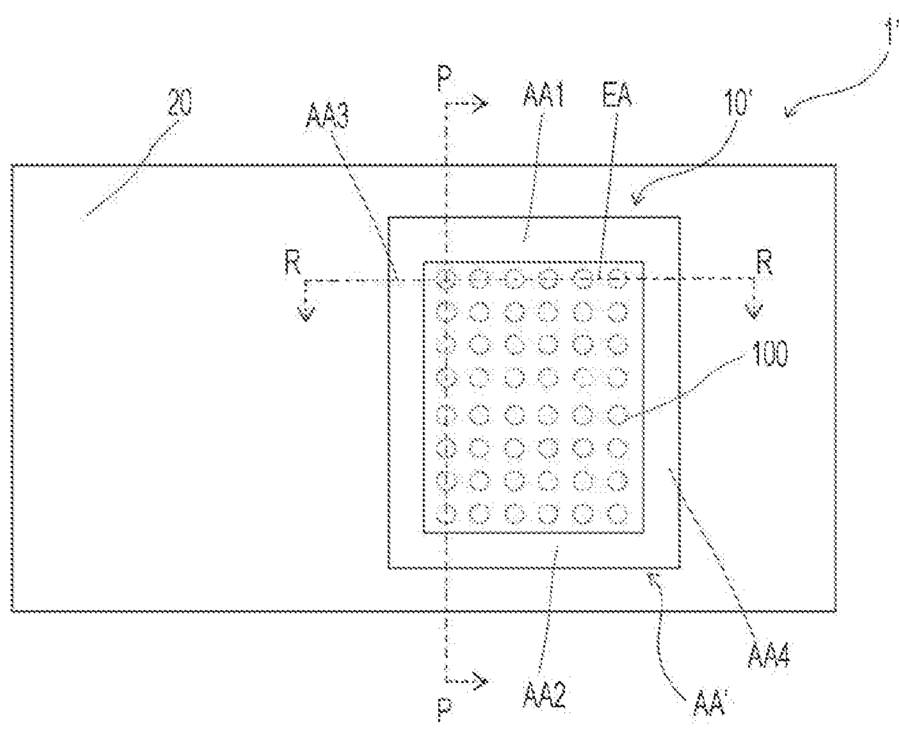
FIG. 33 is a plan view of a surface emitting laser device according to a modification of the present technology.

For example, as in a surface emitting laser device 1' of a modification illustrated in FIG. 33, in an element unit 10', an adjacent area AA' may surround four sides of the element arrangement area EA.

Specifically, for example, the adjacent area AA' may include first and second adjacent areas AA1 and AA2 respectively disposed at positions on one side and another side sandwiching the element arrangement area EA in a first direction, and third and fourth adjacent areas AA3 and AA4 respectively disposed at positions on one side and another side sandwiching the element arrangement area EA in a second direction orthogonal to the first direction.

In FIG. 33, a cross-sectional view taken along line R-R of the third and fourth adjacent areas AA3 and AA4 and the element arrangement area EA is substantially similar to the cross-sectional view taken along line P-P (see FIG. 2).

According to the surface emitting laser device 1', since the adjacent area AA' surrounding the entire periphery of the element arrangement area EA is joined to the driver unit 20 via the plurality of second bumps BP2, it is possible to more reliably suppress variation in interval between the element unit 10' and the driver unit 20.

In the bump forming processing described above, the first bump BP1 in the softened state may be formed in each surface emitting laser element of the element unit, and the plurality of second bumps BP2 in the softened state may be formed in the adjacent area of the element unit.

In the above-described embodiment and modification, both the first and second multilayer film reflectors 102 and 107 are semiconductor multilayer film reflectors, but are not limited thereto.

For example, the first multilayer film reflector 102 may be a semiconductor multilayer film reflector, and the second multilayer film reflector 107 may be a dielectric multilayer film reflector. The dielectric multilayer film reflector is also a kind of distributed Bragg reflector.

For example, the first multilayer film reflector 102 may be a dielectric multilayer film reflector, and the second multilayer film reflector 107 may be a semiconductor multilayer film reflector.

For example, both the first and second multilayer film reflectors 102 and 107 may be dielectric multilayer film reflectors.

In the surface emitting laser device according to the present technology, the first and second spacer layers 104 and 106 are not necessarily provided.

In the surface emitting laser device according to the present technology, the current constriction layer 103 and the oxide constriction layer 103' may be disposed inside the second multilayer film reflector 107.

In the surface emitting laser device according to the present technology, the current constriction layer 103 and the oxide constriction layer 103' are not necessarily provided.

In the surface emitting laser device according to the present technology, at least one of the first and second contact layers 101 and 108 is not necessarily provided.

6. <Example in which Surface Emitting Laser Device is Applied to Distance Measuring Device>

Hereinafter, an application example of the surface emitting laser device according to the above-described embodiment and modification will be described.

Figure 34:
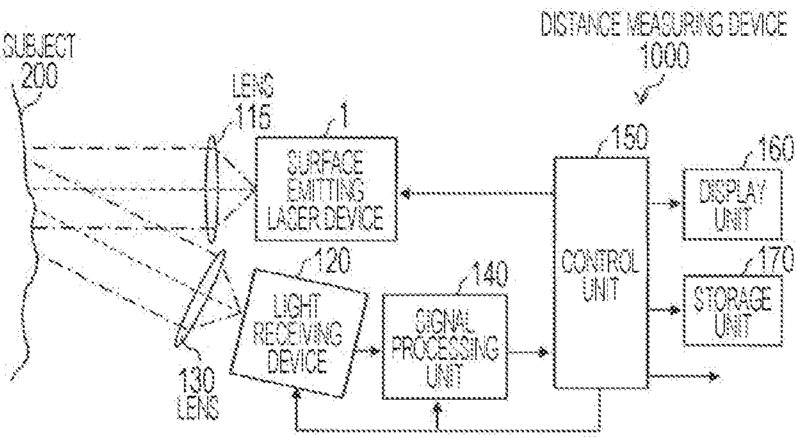
FIG. 34 is a diagram illustrating an application example of a surface emitting laser device according to one embodiment of the present technology and a modification thereof to a distance measuring device.

FIG. 34 illustrates an example of a schematic configuration of a distance measuring device 1000 including the surface emitting laser device 1, as an example of an electronic device according to the present technology. The distance measuring device 1000 measures a distance to a subject 200 by a time of flight (TOF) method. The distance measuring device 1000 includes the surface emitting laser device 1 as a light source. The distance measuring device 1000 includes, for example, the surface emitting laser device 1, a light receiving device 120, lenses 115 and 130, a signal processing unit 140, a control unit 150, a display unit 160, and a storage unit 170.

The light receiving device 120 detects light reflected by the subject 200. The lens 115 is a lens for collimating light emitted from the surface emitting laser device 1, and is a collimating lens. The lens 130 is a lens for condensing light reflected by the subject 200 and guiding the light to the light receiving device 120, and is a condenser lens.

The signal processing unit 140 is a circuit for generating a signal corresponding to a difference between a signal inputted from the light receiving device 120 and a reference signal inputted from the control unit 150. The control unit 150 includes, for example, a time-to-digital converter (TDC). The reference signal may be a signal inputted from the control unit 150, or may be an output signal of a detection unit that directly detects an output of the surface emitting laser device 1. The control unit 150 is, for example, a processor that controls the surface emitting laser device 1, the light receiving device 120, the signal processing unit 140, the display unit 160, and the storage unit 170. The control unit 150 is a circuit that measures a distance to the subject 200 on the basis of a signal generated by the signal processing unit 140. The control unit 150 generates a video signal for displaying information about a distance to the subject 200, and outputs the video signal to the display unit 160. The display unit 160 displays information about the distance to the subject 200, on the basis of the video signal inputted from the control unit 150. The control unit 150 stores information about the distance to the subject 200 in the storage unit 170.

In the present application example, the surface emitting laser device 1 or the surface emitting laser device 1' is applied to the distance measuring device 1000.

7. <Example in which Distance Measuring Device is Mounted on Mobile Object>

The technology (the present technology) according to the present disclosure can be applied to various products. For example, the technology according to the present disclosure may be realized as a device equipped on any type of mobile bodies, such as an automobile, an electric car, a hybrid electric car, a motorcycle, a bicycle, personal mobility, an airplane, a drone, a ship, a robot, and the like.

FIG. 35 is a block diagram illustrating a schematic configuration example of a vehicle control system, which is an example of a mobile object control system to which the technology according to the present disclosure may be applied.

A vehicle control system 12000 includes a plurality of electronic control units connected to each other via a communication network 12001. In the example illustrated in FIG. 35, the vehicle control system 12000 includes a driving system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, a sound/image output unit 12052, and a vehicle-mounted network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various lamps such as a headlamp, a back lamp, a brake lamp, a turn indicator, or a fog lamp. In this case, the body system control unit 12020 may be inputted with radio waves or signals of various switches transmitted from a portable device that substitutes for a key. The body system control unit 12020 receives these input radio waves or signals, and controls a door lock device, the power window device, the lamps, or the like of the vehicle.

The vehicle external information detection unit 12030 detects information about the outside of the vehicle including the vehicle control system 12000. For example, a distance measuring device 12031 is connected to the vehicle external information detection unit 12030. The distance measuring device 12031 includes the above-described distance measuring device 1000. The vehicle external information detection unit 12030 causes the distance measuring device 12031 to measure a distance to an object (the subject 200) outside the vehicle, and acquires distance data obtained by the measurement. The vehicle external information detection unit 12030 may perform object detection processing of a person, a vehicle, an obstacle, a sign, or the like on the basis of the acquired distance data.

The vehicle internal information detection unit 12040 detects information about the inside of the vehicle. The vehicle internal information detection unit 12040 is connected with, for example, a driver state detection unit 12041 that detects a state of a driver. The driver state detection unit 12041, for example, includes a camera that images the driver. On the basis of detection information inputted from the driver state detection unit 12041, the vehicle internal information detection unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the vehicle external information detection unit 12030 or the vehicle internal information detection unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on an inter-vehicle interval, vehicle speed maintaining driving, a warning of collision of the vehicle, a warning of deviation of the vehicle from a lane, or the like.

Furthermore, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the vehicle external information detection unit 12030 or the vehicle internal information detection unit 12040.

Furthermore, the microcomputer 12051 can output a control command to the body system control unit 12020 on the basis of information about the outside of the vehicle acquired by the vehicle external information detection unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the vehicle external information detection unit 12030.

Figure 36:
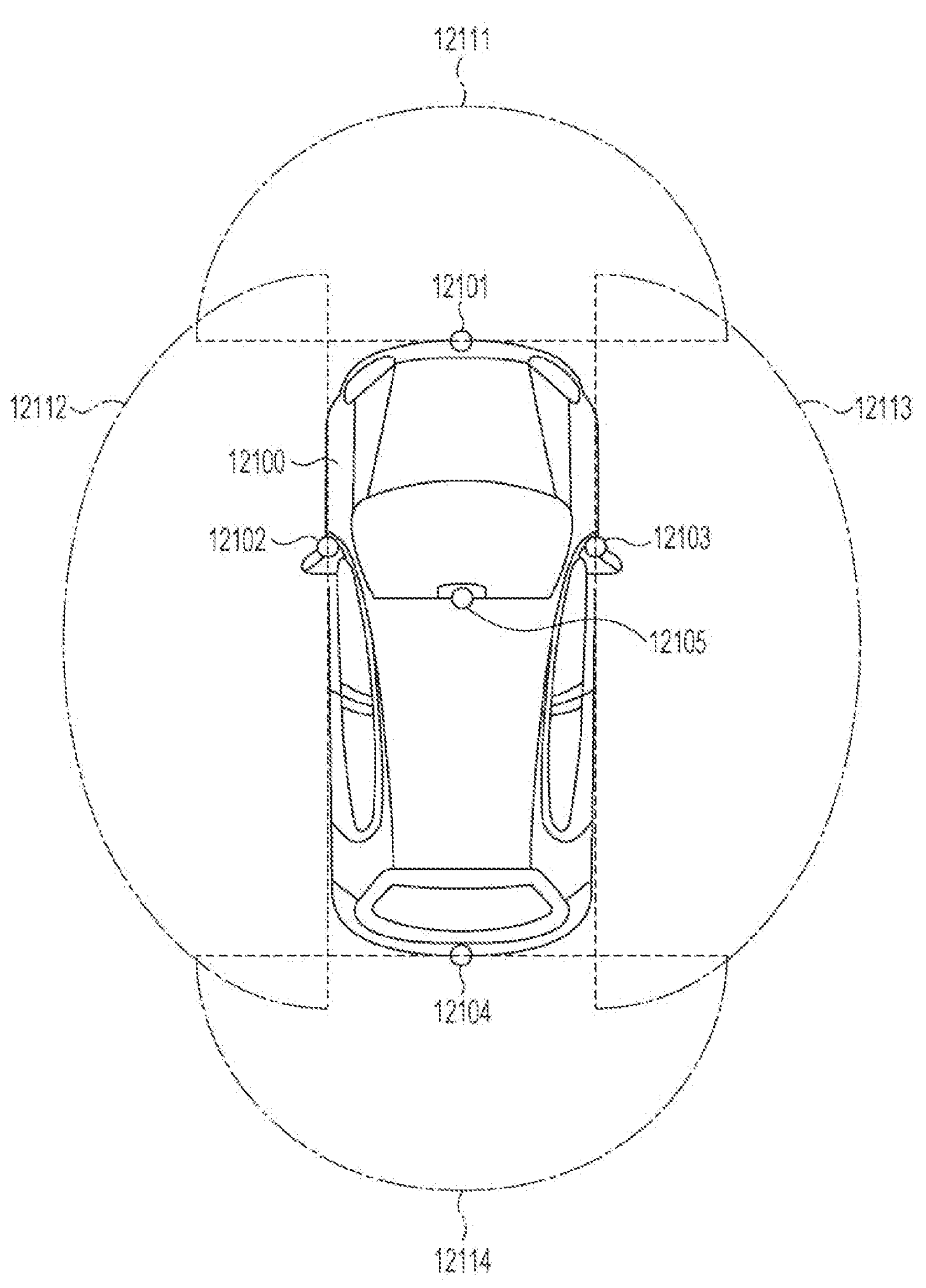
FIG. 36 is an explanatory view illustrating an example of an installation position of the distance measuring device.

The sound/image output unit 12052 transmits an output signal of at least one of a sound and an image to an output device capable of visually or auditorily notifying information to an occupant of the vehicle or the outside of the vehicle. In the example of FIG. 35, an audio speaker 12061, a display unit 12062, and an instrument panel 12063 are illustrated as the output device. The display unit 12062 may, for example, include at least one of an on-board display and a head-up display. FIG. 36 is a view illustrating an example of an installation position of the distance measuring device 12031.

In FIG. 36, a vehicle 12100 includes distance measuring devices 12101, 12102, 12103, 12104, and 12105 as the distance measuring device 12031.

The distance measuring devices 12101, 12102, 12103, 12104, and 12105 are provided at positions such as, for example, a front nose, side mirrors, a rear bumper, a back door, and an upper part of a windshield in a vehicle cabin, of the vehicle 12100. The distance measuring device 12101 provided at the front nose and the distance measuring device 12105 provided at the upper part of the windshield in the vehicle cabin mainly acquire data of a front side of the vehicle 12100. The distance measuring devices 12102 and 12103 provided at the side mirrors mainly acquire data of a side of the vehicle 12100. The distance measuring device 12104 provided at the rear bumper or the back door mainly acquires data of a rear side of the vehicle 12100. The data of the front side acquired by the distance measuring devices 12101 and 12105 is mainly used for detecting a preceding vehicle, a pedestrian, an obstacle, a traffic light, a traffic sign, or the like.

Note that FIG. 36 illustrates an example of detection ranges of the distance measuring devices 12101 to 12104. A detection range 12111 indicates a detection range of the distance measuring device 12101 provided at the front nose, detection ranges 12112 and 12113 individually indicate detection ranges of the distance measuring devices 12102 and 12103 provided at the side mirrors, and a detection range 12114 indicates a detection range of the distance measuring device 12104 provided at the rear bumper or the back door.

For example, the microcomputer 12051 can determine a distance to each three-dimensional object within the detection ranges 12111 to 12114 and a temporal change in the distance (a relative speed with respect to the vehicle 12100) on the basis of the distance data obtained from the distance measuring devices 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Moreover, the microcomputer 12051 can set an inter-vehicle interval to be secured from a preceding vehicle in advance, and perform automatic brake control (including follow-up stop control), automatic acceleration control (including follow-up start control), and the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance data obtained from the distance measuring devices 12101 to 12104, extract the classified three-dimensional object data, and use the extracted three-dimensional object data for automatic avoidance of an obstacle. For example, the microcomputer 12051 distinguishes obstacles around the vehicle 12100 into obstacles that are visible to the driver of the vehicle 12100 and obstacles that are difficult to see. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

An example of the mobile object control system to which the technology according to the present disclosure can be applied has been described above. The technology according to the present disclosure can be applied to the distance measuring device 12031 among the configurations described above.

The surface emitting laser device according to the present technology may be realized as a light source of a device (for example, a laser printer, a laser copier, a projector, a head-mounted display, a head-up display, or the like) that forms or displays an image by laser light.

In the above-described embodiment and modification, the described specific numerical values, shapes, materials (including compositions), and the like are merely examples, and are not limited thereto.

Furthermore, the present technology can also have the following configurations.

(1) A surface emitting laser device including:

an element unit including an element arrangement area in which a plurality of surface emitting laser elements is arranged and an adjacent area adjacent to the element arrangement area;

a driver unit including a driver IC;

a plurality of first bumps that individually joins each of the plurality of surface emitting laser elements and the driver unit; and a plurality of second bumps that joins the adjacent area and the driver unit, in which each of the plurality of first bumps and the plurality of second bumps contains a conductive material that becomes difficult to be crushed by pressurization, and the plurality of second bumps is arranged at a higher density than the plurality of first bumps.

(2) The surface emitting laser device according to (1), in which each of the plurality of surface emitting laser elements has a mesa structure protruding toward the driver unit side and including an electrode at a top, and the electrode and the driver unit are joined via each of the first bumps.

(3) The surface emitting laser device according to (1) or (2), in which the conductive material is metal particle paste.

(4) The surface emitting laser device according to any one of (1) to (3), in which the conductive material is metal nano (5) The surface emitting laser device according to any one of (1) to (4), in which an arrangement density of the plurality of second bumps is higher than an arrangement density of the plurality of surface emitting laser elements.

(6) The surface emitting laser device according to any one of (1) to (5), in which the adjacent area includes at least first and second areas respectively located on one side and another side sandwiching the element arrangement area.

(7) The surface emitting laser device according to any one of (1) to (6), in which the element unit has a multilayer structure including first and second multilayer film reflectors and an active layer disposed between the first and second multilayer film reflectors, the element arrangement area constitutes a part of the multilayer structure in an in-plane direction, and the adjacent area constitutes another part of the multilayer structure in the in-plane direction.

(8) The surface emitting laser device according to any one of (1) to (7), in which the driver unit includes a semiconductor board on which the driver IC is formed, and a wiring layer layered on the semiconductor board, and the wiring layer is joined to the plurality of surface emitting laser elements via the plurality of first bumps, and joined to the adjacent area via the plurality of second bumps.

(9) An electronic device including the surface emitting laser device according to any one of (1) to (8).

(10) A manufacturing method for a surface emitting laser device including: an element unit including an element arrangement area in which a plurality of surface emitting laser elements is arranged and an adjacent area adjacent to the element arrangement area; and a driver unit including a driver IC, the manufacturing method including:

a joining step of joining each of the plurality of surface emitting laser elements and the driver unit via a plurality of first bumps, and joining the adjacent area and the driver unit via a plurality of second bumps, in which the plurality of first bumps and the plurality of second bumps contain a conductive material that becomes difficult to be crushed by pressurization, and in the joining step, the plurality of second bumps is arranged at a higher density than the plurality of first bumps.

(11) The manufacturing method for the surface emitting laser device according to (10), further including: prior to the joining step, a step of arranging the plurality of first bumps in which the conductive material is in a softened state in an area in the driver unit corresponding to the element arrangement area; and a step of arranging the plurality of second bumps in which the conductive material is in a softened state in an area in the driver unit corresponding to the adjacent area at a higher density than the plurality of first bumps.

REFERENCE SIGNS LIST

1, 1' Surface emitting laser device
10 Element unit
20 Driver unit
21 Semiconductor board
22 Wiring layer

100 Surface emitting laser element
102 First multilayer film reflector
105 Active layer
107 Second multilayer film reflector
110 Cathode electrode (electrode)
1000 Distance measuring device (electronic device)
EA Element arrangement area
AA, AA' Adjacent area
AA1 First adjacent area (first area)
AA2 Second adjacent area (second area)
BP1 First bump
BP2 Second bump
MS1 Mesa structure

The invention claimed is:

1. A surface emitting laser device, comprising:
an element unit including:
an element arrangement area that includes a plurality of surface emitting laser elements, and
an adjacent area adjacent to the element arrangement area;
a driver unit including a driver IC;
a plurality of first bumps, wherein each first bump of the plurality of first bumps joins the driver unit to a respective surface emitting laser element of the plurality of surface emitting laser elements; and
a plurality of second bumps that joins the driver unit to the adjacent area, wherein
each first bump of the plurality of first bumps and each second bump of the plurality of second bumps include a conductive material,
the conductive material shifts from a softened state to a cured state by pressurization,
an arrangement density of the plurality of second bumps is higher than an arrangement density of the plurality of first bumps, and
an interval between two adjacent second bumps of the plurality of second bumps is less than an interval between two adjacent first bumps of the plurality of first bumps.

2. The surface emitting laser device according to claim 1, wherein
each of the plurality of surface emitting laser elements has a mesa structure that protrudes toward a side of the driver unit,
the mesa structure includes an electrode at a top of the mesa structure, and
each first bump of the plurality of first bumps joins the driver unit to the electrode of a respective surface emitting laser element of the plurality of surface emitting laser elements.

3. The surface emitting laser device according to claim 1, wherein the conductive material includes metal particle paste.

4. The surface emitting laser device according to claim 1, wherein the conductive material includes metal nano paste.

5. The surface emitting laser device according to claim 1, wherein the arrangement density of the plurality of second bumps is higher than an arrangement density of the plurality of surface emitting laser elements.

6. The surface emitting laser device according to claim 1, wherein
the adjacent area includes:
a first area on a first side of the element unit, and
a second area on a second side of the element unit, and
the element arrangement area is between the first area of the adjacent area and the second area of the adjacent area.

7. The surface emitting laser device according to claim 1, wherein
the element unit has a multilayer structure including:
a first multilayer film reflector,
a second multilayer film reflector, and
an active layer between the first multilayer film reflector and the second multilayer film reflector,
the element arrangement area corresponds to a first part of the multilayer structure in an in-plane direction of the element unit, and
the adjacent area corresponds to a second part of the multilayer structure in the in-plane direction.

8. The surface emitting laser device according to claim 1, wherein
the driver unit includes:
a semiconductor board that includes the driver IC; and
a wiring layer on the semiconductor board,
the wiring layer is joined to the plurality of surface emitting laser elements via the plurality of first bumps, and
the wiring layer is further joined to the adjacent area via the plurality of second bumps.

9. An electronic device, comprising:
a surface emitting laser device that includes:
an element unit including:
an element arrangement area that includes a plurality of surface emitting laser elements, and
an adjacent area adjacent to the element arrangement area;
a driver unit including a driver IC;
a plurality of first bumps, wherein each first bump of the plurality of first bumps joins the driver unit to a respective surface emitting laser element of the plurality of surface emitting laser elements; and
a plurality of second bumps that joins the driver unit to the adjacent area, wherein
each first bump of the plurality of first bumps and each second bump of the plurality of second bumps include a conductive material,
the conductive material shifts from a softened state to a cured state by pressurization,
an arrangement density of the plurality of second bumps is higher than an arrangement density of the plurality of first bumps, and
an interval between two adjacent second bumps of the plurality of second bumps is less than an interval between two adjacent first bumps of the plurality of first bumps.

10. A manufacturing method of a surface emitting laser device, the manufacturing method comprising:
joining a driver unit to each surface emitting laser element of plurality of surface emitting laser elements via a respective first bump of a plurality of first bumps, wherein
the surface emitting laser device includes:
the driver unit; and
an element unit including:
an element arrangement area, and
an adjacent area adjacent to the element arrangement area,
the element arrangement area includes the plurality of surface emitting laser elements, and
the driver unit includes a driver IC; and
joining the driver unit to the adjacent area via a plurality of second bumps, wherein each first bump of the plurality of first bumps and each second bump of the plurality of second bumps include a conductive material, the conductive material shifts from a softened state to a cured state by pressurization, an arrangement density of the plurality of second bumps is higher than an arrangement density of the plurality of first bumps, and an interval between two adjacent second bumps of the plurality of second bumps is less than an interval between two adjacent first bumps of the plurality of first bumps.

11. The manufacturing method of the surface emitting laser device according to claim 10, further comprising:

arranging, prior to the joining of the driver unit to the plurality of surface emitting laser elements, the plurality of first bumps in an area of the driver unit corresponding to the element arrangement area; and arranging, prior to the joining of the driver unit to the adjacent area, the plurality of second bumps at the arrangement density higher the arrangement density of the plurality of first bumps, wherein the plurality of second bumps is arranged in an area of the driver unit corresponding to the adjacent area.

* * * * *